(12) United States Patent
Klipstein

(10) Patent No.: US 10,573,675 B2
(45) Date of Patent: Feb. 25, 2020

(54) DUAL BAND PHOTODETECTOR AND A METHOD THEREOF

(71) Applicant: SEMI CONDUCTOR DEVICES-AN ELBIT SYSTEMS-RAFAEL PARTNERSHIP, Haifa (IL)

(72) Inventor: Philip Klipstein, Zikhron Ya'akov (IL)

(73) Assignee: SEMI CONDUCTOR DEVICES—AN ELBIT SYSTEMS-RAFAEL PARTNERSHIP, Haifa (IL)

( * ) Notice: Subject to any disclaimer, the term of this patent is extended or adjusted under 35 U.S.C. 154(b) by 357 days.

(21) Appl. No.: 15/636,821

(22) Filed: Jun. 29, 2017

(65) Prior Publication Data

US 2018/0019269 A1    Jan. 18, 2018

(30) Foreign Application Priority Data

Jul. 14, 2016 (IL) .......................................... 246796

(51) Int. Cl.
| | | |
|---|---|---|
| H01L 27/144 | (2006.01) | |
| H01L 31/0216 | (2014.01) | |
| H01L 31/0232 | (2014.01) | |
| H01L 31/18 | (2006.01) | |
| H01L 31/0304 | (2006.01) | |
| H01L 31/0352 | (2006.01) | |
| H01L 31/108 | (2006.01) | |
| H01L 31/109 | (2006.01) | |

(52) U.S. Cl.
CPC ...... H01L 27/1443 (2013.01); H01L 27/1446 (2013.01); H01L 31/02161 (2013.01);
(Continued)

(58) Field of Classification Search
CPC ............. H01L 27/1443; H01L 31/1868; H01L 31/184; H01L 31/02327; H01L 31/02161;
(Continued)

(56) References Cited

U.S. PATENT DOCUMENTS

| | | | |
|---|---|---|---|
| 7,687,871 B2 | 3/2010 | Maimon | |
| 8,004,012 B2* | 8/2011 | Klipstein | ............... H01L 31/101 257/196 |

OTHER PUBLICATIONS

Ariyawansa, et al., "Multispectral Imaging with Type II Superlattice Detectors", https://www.spiedigitallibrary.org/conference-proceedings-of-spie, accessed on Dec. 4, 2017, 15 pages.
(Continued)

Primary Examiner — David P Porta
Assistant Examiner — Meenakshi S Sahu
(74) Attorney, Agent, or Firm — Dorsey & Whitney LLP

(57) ABSTRACT

Photodetectors and methods for dual band photo detection are disclosed. The photodetector includes a stack of semiconductor layers defining first and second unipolar photosensitive modules (UPMs) of respectively opposite doping polarities, and a contact layer including at least one of metal and semiconductor materials having doping polarity opposite to that of the second UPM. The first and second UPMs are adapted for sensing radiation of different respective first and second wavelengths ranges. The second UPM is located upon the first UPM thereby forming a first diode junction between the first and second UPMs. The contact layer is located on the second UPM thereby forming a second diode junction between the second UPM and the contact layer. The first and second diode junctions are configured to have respectively opposite conduction directions, enabling selective sensing of electrical signals associated with the first and second wavelengths ranges.

22 Claims, 14 Drawing Sheets

(52) U.S. Cl.
CPC ...... *H01L 31/02327* (2013.01); *H01L 31/184* (2013.01); *H01L 31/1868* (2013.01); *H01L 31/0304* (2013.01); *H01L 31/035236* (2013.01); *H01L 31/108* (2013.01); *H01L 31/109* (2013.01)

(58) Field of Classification Search
CPC . H01L 27/1446; H01L 31/109; H01L 31/108; H01L 31/035236; H01L 31/0304; H01L 31/1013; H01L 31/101; H01L 27/14647; H01L 31/022408
See application file for complete search history.

(56) References Cited

OTHER PUBLICATIONS

Aqariden et al., "Development of Molecular Beam Epitaxially Grown . . . for High Density Vertically-Integrated Photodiode-Based Focal Plane Arrays," Journal of Electronic Materials, 2007, pp. 900-904, vol. 36, No. 8.

Delaunay et al., "Background limited performance of long wavelength infrared focal plane arrays fabricated from Type-II InAs/GaSb M-structure superlattice," Northwestern University, Center for Quantum Devices, EECS Department (12 pages), in *Proc. SPIE*, Infrared Technology and Applications XXXV, article 7298-1Q (2009).

Du et al., "Observation of Quantum Spin Hall Stages in InAs/GaSb Bilyaers under Broken Time-Reversal Symmetry," pp. 1-12.

King et al., "3rd-generation MW/LWIR sensor engine for advanced tactical systems," Proceedings of SPIE, 2008, pp. 69402R-1-69402R-12, vol. 6940.

Klipstein et al., Israeli Patent Application No. 238368 with Filing Receipt, filed Apr. 19, 2015 (74 pages).

Klipsten, "XBnn and XBpp infrared detectors," Journal of Crystal Growth, 2015, pp. 351-356, vol. 425.

Mott, "Metal-Insulator Transitions," 1974, pp. 30-41.

Stradling et al., "Growth and Characterisation of Semiconductors," Conductivity Measurements, pp. 171-173, Adam Hilger: Bristol and New York (1990).

\* cited by examiner (various pixel designs)

DUAL BAND PHOTODETECTOR AND A METHOD THEREOF

TECHNOLOGICAL FIELD

The invention is in the field of dual band photodetectors and particularly relates to dual band photo detection focal plane arrays (FPAs) operative for sensing light in the infrared regime.

REFERENCES

[1] D. F. King et al., *Proc. SPIE* 6940, Infrared Technology and Applications XXXIV, article 2R (2008)

[2] F. Aqariden et al., *Journal of Electronic Materials* 36, 900 (2007)

[3] U.S. Pat. No. 8,004,012 (Klipstein, 2006)

[4] P. C. Klipstein, *Journal of Crystal Growth*, 425, 351 (2014)

[5] U.S. Pat. No. 7,687,871 (S. Maimon, 2006)

[6] N. F. Mott "*Metal-Insulator transitions*", Chapter 1, section 1.7, pp. 30-40, $1^{st}$ Edition, Taylor and Francis: London (1974)

[7] Du et al., arXiv: 1306.1925

[8] R. A. Stradling and P. C. Klipstein, *Growth and Characterisation of Semiconductors*, p 171 (section 4), Adam Hilger: Bristol and New York (1990)

[9] P. Y. Delaunay et al, in *Proc. SPIE* 7298, Infrared Technology and Applications XXXV, article 7298-1Q (2009)

BACKGROUND

Dual band photo-detection devices are increasingly used for selective sensing of light radiation in two or more wavelengths bands.

Conventional dual band photo-detection devices are, such as that disclosed in the article in Ref [1], generally configured to define two bi-polar photosensitive components (such as photodiodes and/or phototransistors) serially arranged back to back to one another (i.e. with their conduction directions being respectively opposite to one another). Another configuration of a photodiode based dual band photodetector is described for example in Ref [2].

Standard photodiode (or more generally a bi-polar photosensitive component, hereinafter referred to simply as photodiode or photodiode junction) is used herein to generally designate a component including a p-n or p-i-n photodiode junction (namely adjacent n-type and p-type semiconductor layers with possibly an intrinsic layer between them) defining a depletion region between the n-type and p-type semiconductor layers, in which the photon absorbing layer resides at least partially within the depletion region of the junction. In other words, in the standard photodiodes (photodiode junctions), the band gap in at least part of the depletion region matches the band of radiation wavelengths which is to be detected/absorbed, such that a photon absorbing layer for absorbing photons of the correct wavelengths is defined at least partially within (and typically also in regions adjacent to) the depletion region. When such a bi-polar photosensitive component (photodiode) is under forward bias voltage it is generally conductive, regardless of any absorption of photons. When the bi-polar photosensitive component is under reverse bias voltage, the photons absorbed in the photon absorbing layer excite carriers which are removed by the built-in voltage in the depletion region, due to the reverse bias voltage, thereby giving rise to a photocurrent flowing across the bi-polar photosensitive component.

Accordingly, in dual band photo-detection devices which include two serially arranged back to back photodiode junctions (bi-polar photosensitive components) sensitive to different wavelengths, the sensed wavelengths can be selectively controlled by the direction of the bias voltage (at each time setting the applied bias voltage such that one photodiode junction is under a reverse bias causing it to generate photocurrent in response to light absorbed thereby, and the other photodiode junction is under forward bias causing it to "short circuit" (i.e. to conduct easily) and thereby conduct the photocurrent from the reverse biased photodiode).

However, bi-polar photosensitive components such as photodiodes and phototransistors, in which at least part of the photon absorbing region is depleted (namely in which the photon absorbing region generally includes part or all of the depletion region), are deficient in terms of their reverse bias dark current which deteriorates their signal-to-noise ratio (SNR). The term "dark current" is commonly used in the art to define the current flowing in a photosensitive component during a total dark condition (no photons of the correct wavelength incident on the photodetector). The signal-to-noise ratio in photosensitive components, particularly those operable for sensing light in the infrared (IR) regime, is conventionally improved by cooling the component, in some cases down to very low temperatures close to 0° K. The means for cooling and maintaining such a low temperature in photosensitive components, however, are cumbersome and expensive, and in any case can only reduce the noise down to a limited value.

There are many applications in which the level of light which is required to be sensed is very low, and therefore the sensitivity of the photosensitive components (typically photodiodes and/or possibly phototransistors) in the photo-detection devices is a critical requirement. It is well known in the art that the signal-to-noise ratio which can be obtained from the photosensitive components is limited by the level of the "thermal noise", which in turn is related to the temperature of the component.

The dark current in bipolar photo-detection components is generally composed of two main constituents. The first constituent, hereinafter referred to as "the diffusion" dark current, is due to the thermal excitation of carriers across the complete energy band gap of the photon absorbing material(s)/layer(s) of the photosensitive component, followed by diffusion of the minority carriers thus created to the depletion region. The second component affecting the level of the dark current is known as the "Generation-Recombination" current, hereinafter referred to as "G-R" dark current. A reverse bias voltage applied to the bi-polar photosensitive component activates these G-R centers (also known as Shockley-Read-Hall (SRH) traps) in the depletion region thereof (e.g. near the interface between p-type and n-type doped semiconductor materials in the component), because it increases the electric field in the depletion region thereby removing mobile carriers the moment they are created when an electron transfers in or out of a SRH trap, i.e. enhancing "Generation" and preventing "Recombination". The effect is particularly strong for those SRH traps close to the middle of the band gap, when the energies between the trap and each of the conduction and valence band edges are nearly equal (i.e. approximately equal to half the band gap).

The level of diffusion current can be significantly reduced by cooling the photosensitive component, to reduce the amount of thermally excited charge carriers in the photon absorbing region.

As for the level of "G-R" dark current, although it can also be reduced by cooling, it is reduced at a slower rate than the diffusion current. This is because due to the G-R centers in the depletion region, the amount of thermal energy or "activation energy" needed to excite an electron (charge carrier) in the depletion region from the valence band to a SRH trap, or from a SRH trap to the conduction band, is approximately halved compared with the activation energy for the diffusion current process. As mentioned above, when electron-hole pairs are generated in this way, they are immediately removed by the electric field of the depletion region, thereby providing a strong driving mechanism for the G-R current. Thus the level of the G-R dark current is reduced by cooling at a slower rate than the diffusion current, due to its smaller activation energy. At low temperatures, where the level of the diffusion dark current is reduced sufficiently, the G-R dark current generally becomes the most dominant component of the dark current.

Indeed, another way to reduce the level of G-R dark current is to increase the band gap in the depletion region, so that the most effective SRH traps which are near the middle of the band gap in the depletion region are further in energy from the nearest conduction and valence bands, thereby increasing the activation energy of the G-R process and thus suppressing the G-R current.

However, in conventional bi-polar photosensitive components, such as photodiodes and phototransistors, the depletion region extends into the photon absorbing layer of the components and therefore the band gap of the photon-absorbing layer, which is a-priori designed to match the photon energy of the wavelength band to be absorbed/sensed by the component, is at least partially in the depletion region. This makes conventional bi-polar photosensitive components deficient in terms of the level of G-R currents provided thereby, especially at lower temperatures where G-R current becomes the dominant dark current noise component.

Also, in some infra-red sensing materials like $Hg_{1-x}Cd_xTe$, a large positive offset in the conduction band (i.e. the conduction band is higher in energy for larger values of x) and a large negative offset in the valence band (i.e. the valence band is lower in energy for larger values of x) prevent a photodiode design with an abrupt change in composition (e.g. an abrupt change in the x-value) since this will block the free flow of minority carriers. To this end, in cases where the band gap can only be changed gradually in order to ensure that the bands remain smooth, the band gap in at least part of the depletion region is not very different from that in the photon absorbing layer and lies within the range of wavelengths to be detected. In such cases if there are G-R centers in the band gap they will contribute a significant G-R dark current noise in the detector.

As mentioned above, it is desirable to increase the band gap in the depletion region in order to suppress G-R processes therein. Recently, new types of unipolar semiconductor photo-detection components or photodetectors have been proposed in which the majority carriers in the photon absorbing layer are blocked by a barrier while the minority carriers can flow freely (see for example U.S. Pat. No. 8,004,012). These devices include a photon absorbing layer and barrier layer (with a much larger band gap) having the same doping polarity (e.g. n-type in XBn devices and p-type in $XB_pp$ devices, terminology defined in for example in Ref [4] and often shortened simply to XBn or XBp). In these devices, the same doping polarity in the photon absorbing layer and the barrier layer ensures that a depletion region is not formed anywhere within the photon absorbing layer (i.e. near the junction between it and the barrier layer) thereby suppressing the level of G-R current from the photon absorbing layer. In some cases the band gap of the barrier layer is made very large (e.g. using suitable hetero-structures), such that G-R processes in the barrier layer are greatly suppressed, therefore strongly suppressing the G-R current from the barrier layer which is always depleted. In such unipolar devices the dark current noise of the detector is very low (diffusion limited) and is mainly due to diffusion dark current which can be effectively controlled by cooling the component.

U.S. Pat. No. 8,004,012 also discloses (see FIG. 7a therein) a dual band unipolar photo-detection structure including first and second photon absorbing layers of the same doping polarity spaced from each other by a barrier layer, also with the same doping polarity.

In addition to the dark current, for pixilated photodetector devices, which comprise a lateral arrangement of pixels (plurality of photosensitive components/regions), noise may be introduced to the signals of the photosensitive components (pixels) due to an unwanted surface leakage current which causes cross conduction between the pixels, or parasitic conduction between the pixels and the common contact. These surface currents are often relatively insensitive to temperature and usually cannot be totally eliminated by cooling the device. Surface currents are most effectively suppressed by applying an appropriate passivation treatment to the exposed surfaces of the photodetector, however the effectiveness of this treatment depends on the materials used in the photodetector and in the passivation treatment.

General Description

There is a need in the art for a novel dual band photodetector, providing low levels of dark current. Particularly there is a need in the art for a dual band photodetector capable of operation in at least one of its detection bands, in the long wave infra-red regime (LWIR: about 8 to 12 microns) with diffusion limited dark current.

As indicated above, photodiode based dual band photodetectors, such as those associated with n-p-n or p-n-p semiconductor structures defining two back to back photodiode junctions, are generally associated with relatively high levels of G-R currents, and are thus deficient in terms of their signal to noise ratio since their level of dark current is not diffusion limited. This is particularly disadvantageous when detecting long wavelength ranges such as the mid-wave IR (MWIR: about 3 to 5 microns), or the even longer LWIR range, since the longer the wavelength, the smaller the photon energy and thus the energy band gap in the photon absorbing region of the photodetector is smaller, which leads to higher and more emphasized dark currents at a given temperature as compared to the case where shorter (more energetic) wavelengths are detected.

In this regard, it should be understood that the terms photodiode and photodiode junction are used herein to indicate a diode junction (e.g. p-n junction or p-i-n junction) in which a photon absorbing layer resides at least partially within the depletion region of the junction and generates an electrical signal under a reverse bias in response to illumination by photons with the wavelengths of interest that are to be detected. Typically the bands vary smoothly from the n-side to the p-side with no large steps or discontinuities, and the photon absorbing layer resides on at least one side of the junction such that at least part of it is depleted by the built-in electric field of the diode junction. Thus part of the incident light is absorbed in the photon absorbing layer and part is absorbed in the depletion region. The depletion region also contributes a significant G-R dark current.

Conversely, the term diode or diode junction is used herein to indicate a regular diode junction (p-n or p-i-n junction), which rectifies current (i.e. conducts easily in one direction) but does not generate an electrical signal under a reverse bias in response to illumination by photons with the wavelengths of interest. A regular diode junction differs from a photodiode junction in the sense that the energy band gap in at least part of the depletion region is sufficiently high (substantially higher than the energy of the photons of interest) such that it does not absorb photons with the wavelengths of interest and is aligned such that it blocks any current flow from carriers generated by the absorption of said photons in other parts (if any) of the depletion region.

Indeed, dual band nBn or pBp photodetectors, such as those disclosed in U.S. Pat. No. 8,004,012, are advantageous over photodiode based dual band photodetectors in terms of the dark currents emanating therefrom, and may in some cases be configured to yield only a diffusion limited dark current.

However, in some implementations of such unipolar photodetectors (e.g. particularly in implementations involving a pBp architecture), passivation, the aim of which is to prevent surface currents and/or cross conduction between pixels of the photodetectors, may be difficult when using conventional ex-situ passivation techniques. An example of the need for a stable passivation treatment in a pBp detector architecture made with III-V semiconductor superlattice materials is given for example in Israeli patent application No. 238,368 which is assigned to the assignee of the present invention. In some implementations, particularly in implementations involving an nBn architecture, in which the barrier layer is an n-type III-V semiconductor material, conventional ex-situ passivation techniques may often be used. However, when the photon absorbing material is a III-V type II superlattice material, the mobility of minority carriers in the n-type photon absorbing layers will be very low unless thin layers are used in each period of the superlattice. For the detection of long photon wavelengths such as the LWIR, however, larger thicknesses are typically used in the layers of the superlattice, leading to a low minority carrier diffusion length, and impairing the ability of the detector to detect LWIR photons. Examples are cited in Ref. [4].

The present invention solves the above deficiency of conventional techniques and provides a novel photodetector configuration and a method of fabricating the same, which is on the one hand suitable for dual band detection of relatively long wavelength ranges (e.g. within the MWIR and/or within the LWIR and/or combinations of both MWIR and LWIR) with low/diffusion-limited dark currents and with sufficiently large minority carrier diffusion lengths, and on the other hand enables the use of easily implemented techniques to passivate the device and isolate pixels thereof to provide negligible cross conduction between the pixels.

Thus, according to a broad aspect of the present invention there is provided a photodetector for dual band photo detection, wherein the photodetector includes: a stack of semiconductor layers defining a first and a second unipolar photosensitive module (UPM) of respectively opposite doping polarities, and a contact layer comprising at least one of a metal material and a semiconductor material having doping polarity opposite to that of the second UPM. The first and second UPM are respectively adapted for sensing radiation of different respective first and second wavelength ranges. The second UPM is located upon said first UPM along a certain direction thereby forming a first diode junction between the first and second UPM. The contact layer is located on said second UPM thereby forming a second diode junction between the second UPM and the contact layer. The first and second diode junctions have respectively opposite conduction directions thereby enabling to selectively sense electrical signals associated with said first and second wavelength ranges.

According to some embodiments of the photodetector of the present invention the conduction direction of the first diode junction is opposite to the certain direction indicated above, which defines the order of the first and second UPMs. Accordingly, application of reverse bias voltage to said first diode junction along that certain direction provides removal of excess minority carriers of a first charge polarity, which are created in response to absorption of radiation of the first wavelength range by said first UPM. The excess minority carriers are removed from said first UPM to said first diode junction thereby enabling said first diode to operate in the reverse bias applied thereto for passing photocurrent associated with the absorption of said radiation of the first wavelength range, and thereby generating a first electrical signal indicative of said radiation of the first wavelength range.

According to some embodiments of the photodetector of the present invention the conduction direction of said second diode junction is along the certain direction indicated above, (which defines the order of the first and second UPMs). Accordingly, application of reverse bias voltage to said second diode junction in a direction opposite to that certain direction provides for removal of excess minority carriers of a second charge polarity opposite to said first charge polarity, which are created in response to absorption of radiation of the second wavelength range by said second UPM. The excess minority carriers are removed from said second UPM to said second diode junction, thereby enabling said second diode to operate in the reverse bias applied thereto for passing photocurrent associated with the absorption of said radiation of the second wavelength range thereby generating a second electrical signal indicative of said radiation of the second wavelength range.

According to some embodiments the first UPM includes a first photon absorbing layer and a first barrier layer. The first photon absorbing layer defines a first energy band gap adapted for absorbing photons with energy of said first wavelength range. The first barrier layer is configured with an energy band gap higher than said first energy band gap of the first photon absorbing layer. The first photon absorbing layer and at least a region of the first barrier layer, which interfaces the first photon absorbing layer, have a certain similar first doping polarity, such that said first photon absorbing layer and that region of the first barrier layer form said first unipolar module with no depletion region formed in the first photon absorbing layer. This thereby results in diffusion limited dark current from said first photon absorbing layer.

It should be noted that in some implementations the energy band structure of said first barrier layer is configured such that the first barrier layer defines an energy band barrier for majority carriers associated with said first doping polarity and such that minority carriers of the photon absorbing layer associated with said first doping polarity can flow across said first barrier layer.

According to some embodiments the second UPM includes a second photon absorbing layer and a second barrier layer. The second photon absorbing layer defines a second energy band gap adapted for absorbing photons with energy of said second wavelength range. The second barrier layer is configured with an energy band gap higher than said second energy band gap of the second photon absorbing layer. The second photon absorbing layer and at least a region of the second barrier layer, which interfaces the second photon absorbing layer, have a certain similar second doping polarity which is opposite to said first doping polarity (of the first UPM), such that said second photon absorbing layer and the region of the second barrier layer form said second unipolar module, with no depletion region formed in the second photon absorbing layer. This thereby results in diffusion limited dark current from said second photon absorbing layer.

It should be noted that in some implementations the energy band structure of said second barrier layer is configured such that the second barrier layer defines an energy band barrier for majority carriers associated with said second doping polarity and such that minority carriers of the photon absorbing layer with said second doping polarity can flow across said second barrier layer.

According to some embodiments of the present invention the photo detector includes a plurality of pixels. Accordingly, the contact layer includes a respective plurality of spaced apart electric contact regions laterally arranged to define said plurality of pixels.

To this end in some implementations the photodetector includes trenches that are vertically etched down to at least a barrier layer of the first UPM, between said spaced apart electric contact regions which define said plurality of pixels. The trenches suppress cross conduction of electrical signals between said pixels.

Alternatively or additionally in some implementations the second UPM is configured such that a level of disorder in the periodicity of the photon absorbing layer thereof is sufficiently high such that a valence energy band of the majority carriers in said photon absorbing layer is below a minimum metallic conductivity. This provides for suppressing (in some cases effectively eliminating) cross conduction of electrical signals between said pixels originating due to absorption of light in said first UPM.

It should be noted that in some embodiments of the present invention the photo detector includes an in situ passivation structure in regions between said plurality of spaced apart electric contact regions. The in situ passivation structure generally includes at least one layer that is located on the second barrier layer and has a large energy band gap, and includes a material having a high density of surface states. The material with the high density of surface states forces/pins the equilibrium Fermi level of the passivation structure to be within its large energy band gap, away from the conduction and valence bands of the second barrier layer. This thereby reduces surface leakage and suppresses cross conduction between the pixels.

The phrase passivation herein should be understood as relating to electrical passivation of the surface/interface of a semiconductor layer aimed at reducing preventing electric conduction through the surface/interface (e.g. prevent surface currents), and possibly in some cases it also relates to protection of the surface/interface from oxidation/degradation in an external atmosphere.

In this regard it should be understood that in some embodiments/implementations of the present invention conventional ex-situ passivation may be used to passivate surfaces of an integrated structure/device, after the fabrication/deposition of the crystallized layers of the photodetector in a growth chamber (e.g. in which the layers are grown by an epitaxial growth method such as molecular beam epitaxy).

However, in some implementations of the present invention, an ex-situ passivation technique may be less suitable and may provide poor results. Specifically, ex-situ passivation may be less suitable in implementations of the photodetector in which certain semiconductor layers of the photodetector, such as the second barrier layer, are made of, or include, a superlattice semiconductor structure, such as a Type II superlattice, particularly in the case where the Type II superlattice of the second barrier layer is doped p-type. This is because in such cases it might be hard to find suitable materials for ex-situ passivation of the semiconductor layers (e.g. the second barrier layer), whereby the suitable materials should have appropriate adhesion properties and appropriate distribution of bulk and surface states that can prevent surface conduction.

Thus according to certain embodiments of the present invention a novel technique for in-situ passivation of certain device layers of the photodetector is used. This is based on the inventor's understanding of the following. Surface current leakage may generally be prevented/reduced if the equilibrium Fermi level at exposed/etched surfaces of the device layer structure is pinned in the band gap region of the device layer structure. Here, the term device layer(s) or device layer structure is used to designate a structure formed by one or more functional layers, such as a barrier layer(s), and/or photon absorbing layer(s). Such pinning of the equilibrium Fermi level prevents/reduces surface current leakage in such cases where the device layer structure might act as its own passivation. However, in cases where the equilibrium Fermi level at exposed/etched surfaces of the device layer structure (e.g. between mesas) is not pinned in the band gap region (which may be a result of the use of glue under-fill), the exposed/etched surfaces might conduct/leak current (e.g. formed mesas will not be sufficient to isolate between different modules/pixels of the integrated device or to stop leakage to a common contact), and in such cases an additional passivation treatment/structure/layer might be needed.

To this end in some embodiments of the present invention, some device layers are passivated by utilizing an in-situ passivation technique, which includes in-situ growth of a crystallized semiconductor passivation layer having a large band-gap (configured such that the Fermi level is located within the large band gap), on top of the device layer which is to be passivated, followed by in situ growth of an additional layer, referred to herein as a cap layer, which is a crystallized layer having a high density of surface energy states which cause pinning down of the Fermi level such that also at the surface it remains within the large band gap of the passivation layer. The technique for in-situ passivation which is used in various embodiments of the present invention is described in further detail in Israeli patent application No. 238,368 which is assigned to the assignee of the present invention and incorporated herein in its entirety by reference.

In this connection it should be noted that according to some embodiments of the present invention one or more of the device layers (e.g. the photon absorbing layers and/or the barrier layers and/or the contact layer) are formed utilizing superlattice semiconductor layers/structures. In-situ grown passivation layers and/or a passivation layer structure (herein after also termed passivation structure) is specifically useful for passivation of superlattice semiconductor layers/ structures and semiconductor materials of type/group III-V. For example, in some embodiments type II superlattices (T2SLs), are made from semiconductor materials comprising type/group III-V materials, which may include semiconductor layers with combinations of one or more of Indium, Gallium and Aluminium (In, Ga and Al) from group III of the periodic table with one or more of Antimony and Arsenic (Sb and As) from group V, which may also be fabricated to form multilayer superlattice structures with predesigned energy band structures. Type/group III-V semiconductor materials, in many cases formed as T2SLs, are in some cases advantageously used in the fabrication of photodetector arrays (herein after photodetectors) due to the ability to design the band structure and optical and electrical properties of photon absorbing layers of such detectors and absorb desired wavelengths.

According to some embodiments of the present invention the photodetector is configured such that the photons of the second wavelength range have energy lower than photons of the first wavelength range. More specifically in some implementations the photodetector is configured such that photons to be detected propagate in the general direction from the first UPM having a first photon absorbing layer of a first energy band gap to the second UPM having a second photon absorbing layer of a second energy band gap lower than the first energy band gap.

In some implementations of the photodetector, the doping polarity of the second UPM is p-type doping polarity. Configuring the doping polarity of the second UPM to be p-type may be advantageous for detecting the LWIR wavelength range. To this end, in some cases, the second wavelength range is LWIR, and the photon absorbing layer of the second UPM is configured with an energy band gap adapted for absorption of photons in the LWIR. In this case the p-type doping polarity of the second UPM (i.e. as opposed to n-type doping) provides for improved mobility of minority charge carriers generated in the photon absorbing layer of the second UPM in response to absorption of the LWIR photons. This enables the minority carriers to generate an electrical signal in the contact layer.

In some implementations of the photodetector, the contact layer is a metal material coupled to the second UPM of the p-type doping polarity. The metal contact layer thereby forms the second diode junction as a Schottky diode.

In some embodiments where the second UPM is p-type, the photodetector includes an in-situ passivation structure which includes at least one in-situ passivation layer located fabricated in-situ on a barrier layer of the second UPM having the p-type doping polarity. The in-situ passivation layer has a large energy band gap, and includes a material having a high density of surface states for forcing pinning of an equilibrium Fermi level of the passivation structure to be within its large energy band gap, away from the conduction and valence bands of the second barrier layer.

In some embodiments of the photodetector, the contact layer includes a plurality of spaced apart metal contact regions electrically coupled at exposed regions of the barrier layer of the second UPM, at which the in-situ passivation structure is absent. The spaced apart metal contact regions define a plurality of pixels of the photodetector; and the in-situ passivation structure provides for suppressing cross conduction of electrical signals between the pixels.

In some implementations where the second UPM has p-type doping polarity, the contact layer includes semiconductor material having n-type doping polarity coupled to the second UPM of the p-type doping polarity thereby forming the second diode junction as an n-p diode.

In implementations where the second UPM has p-type doping polarity, the doping polarity of the first UPM is n-type thereby providing the first diode junction between the first and second UPMs in the form of an n-p diode.

Alternatively, in some embodiments of the photo detector, the second UPM has n-type doping polarity, the contact layer includes semiconductor material having p-type doping polarity coupled to the second UPM of the n-type doping polarity thereby forming the second diode junction as an n-p diode. To this end, in such implementations the photodetector may include an ex-situ passivation that is applied to a barrier layer of the second UPM which has the n-type doping polarity.

In implementations, where the doping polarity of the first UPM is p-type, an opposite n-type doping polarity exists for the second UPM and the first diode junction is formed as an n-p diode, and the passivation may include ex-situ passivation applied to n-type barrier layer of the second UPM. It is noted that in cases the in-situ passivation is used, the contact layer is typically/preferably metallic (namely not semiconductor). This is because it is presently not practical to grow both a semiconductor contact layer and an in-situ passivation layer in-situ on the second barrier layer.

According to some embodiments of the present invention the photodetector is configured such that the first wavelength range of the first UPM is within the MWIR, and the second wavelength range of the second UPM is within the LWIR.

Alternatively, in some embodiments the photodetector is configured such that the first wavelength range is a first band of the MWIR and the second wavelength range is a second band within the MWIR with wavelengths longer than the first band.

According to some embodiments of the present invention the photo detector includes one or more electric contact bumps electrically coupled to one or more spaced apart regions of the contact layer. The contact bumps serve as pixel electric contacts and are associated with one or more respective pixels of the photodetector.

In some implementations at least one of the first photon absorbing layer of the first UPM and the conducting buffer layer or substrate layer on which the first photon absorbing layer it is grown, is electrically coupled to at least one electric contact bump which serves as a common contact (e.g. ground) of the photo detector. To this end the photodetector may be associated-with/connectable to a voltage source that is connectable in between at least one pixel contact and the common contact. The voltage source may be selectively operable for applying positive and negative voltages in between the pixel and common contacts to selectively obtain an electrical signal indicative of detection of radiation in the second and first wavelength ranges respectively.

According to some embodiments of the present invention the photodetector includes at least one layer (reflective layer which may be the contact layer and/or additional reflective material) located above the second UPM. The reflective layer is configured to have reflective properties with respect to at least the second wavelength band such that radiation in the second wavelength range is reflected from the reflective layer back for a second pass across the second UPM.

According to another broad aspect of the present invention there is provided a method for fabrication of a photodetector for dual band photo detection. The method includes:

(a) fabricating a first unipolar photosensitive module (UPM) of a first doping polarity. The fabrication of the first UPM comprising:
   growing a first photon absorbing layer on the substrate doped with a certain first doping polarity;
   growing a first barrier layer doped in at least a first region thereof, which interfaces with the first photon absorbing layer, with the same first doping polarity;
(b) fabricating a second UPM of a second doping polarity opposite to the first doping polarity on top of the first UPM thereby forming a first diode junction between the first and second UPMs. The fabrication of the second UPM comprises:
   growing a second photon absorbing layer doped with the second doping polarity above the first barrier layer;
   growing a second barrier layer with at least a region thereof interfacing the second photon absorbing layer, doped with the second doping polarity;
(c) fabricating a contact layer above the second barrier layer to thereby form a second diode junction between the second UPM and the contact layer.

In some embodiments the method also includes step (d) for passivating the photodetector.

For instance in some implementations the passivating step includes growing an in-situ passivation structure on top of the second barrier layer. In this case the step of fabricating of the contact layer includes etching vias through the in-situ passivation structure to expose spaced apart regions of the second barrier layer and depositing spaced apart metallic contacts on the exposed regions of the second barrier layer.

Alternatively in some cases the step of fabrication of the contact layer includes growing, in-situ on the barrier layer, a semiconductor contact layer doped with the first doping polarity being opposite to the second doping polarity of the second barrier layer, and etching the contact layer to define one or more spaced apart contact regions surrounded by exposed regions of the second barrier layer. In this case the step of passivation may include applying ex-situ passivation to the exposed regions of the second barrier layer.

In some embodiments the method also includes etching trenches down to the first barrier layer, in order to isolate between pixels.

Alternatively or additionally, growing of the second photon absorbing layer may include introduction of a disordered distribution of ionized dopants to thereby localize majority carriers of the second photon absorbing layer. This may also provide for isolating between the pixels.

According to yet another broad aspect of the present invention there is provided a method for dual band photo detection. The method may, for example, be carried out with photodetectors configured according to the present invention as described above. The method includes:
   providing a photodetector including first and second unipolar photosensitive modules (UPMs) that are adapted for sensing radiation of different respective first and second wavelength ranges and a contact layer, coupled together along a general direction of radiation propagation through the photodetector. The first and second UPMs have respectively opposite doping polarities such that a first diode junction of a first conduction direction is formed between the first and second UPMs, and the contact layer is located on the second UPM to form a second diode junction of a second conduction direction, being opposite to the first conduction direction; and
   operating the photodetector for selectively sensing a selected one of the first and second wavelength ranges by applying reverse bias voltage to a respective one of the first and second diode junctions to thereby enable selective collection of photocurrent generated by a respective one of the first and second UPMs and associated with a respective one of the first and second wavelength ranges.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

7A) and the absorption spectrum (FIG. 7B), of an n-type, type II, InAs/GaSb, super lattice configured as a photon absorbing layer for radiation in the MWIR regime.

DETAILED DESCRIPTION OF EMBODIMENTS

Figure 1A:
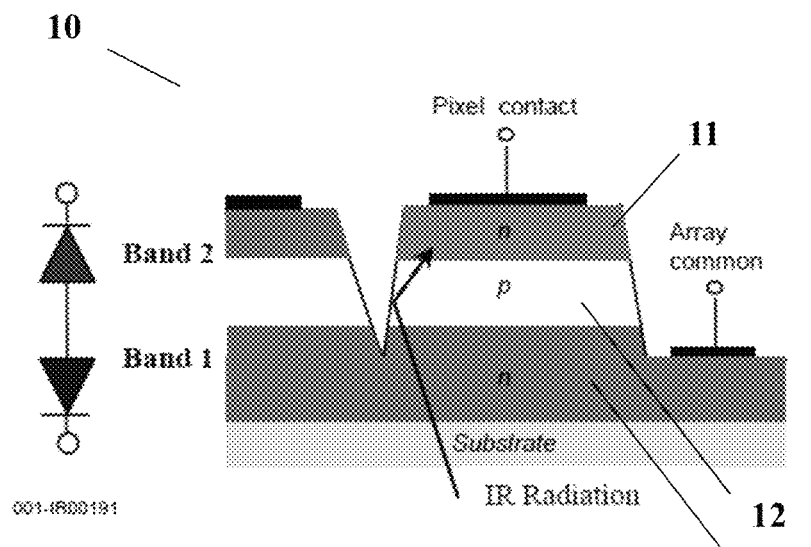
FIGS. 1A to 1C are illustrations of conventional dual band photodetector configurations generally known in the art.
Figure 1B:
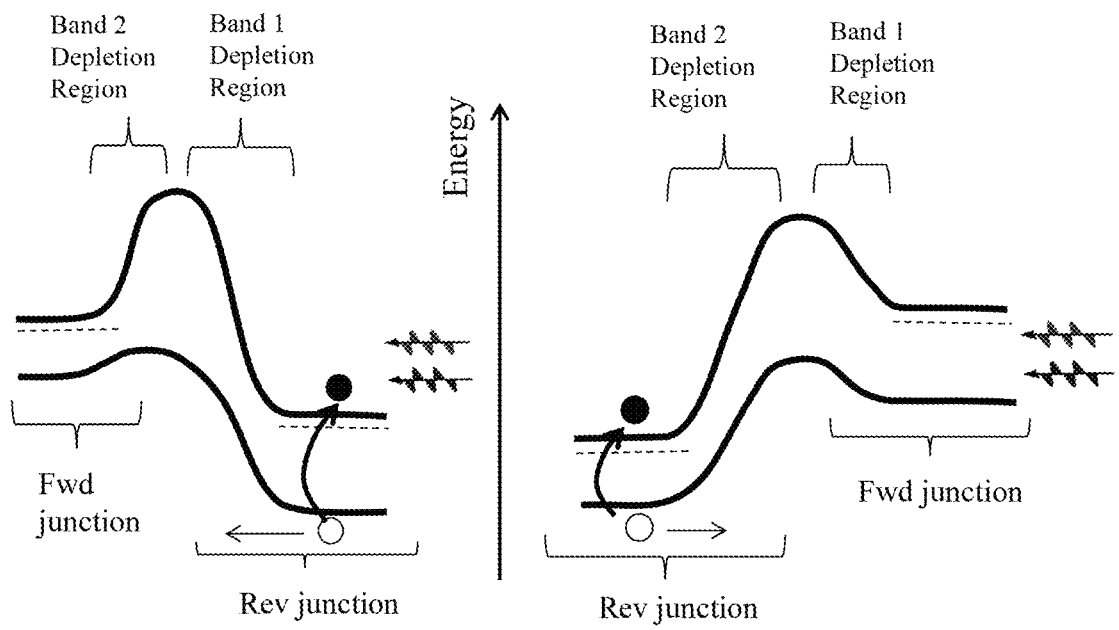
Figure 1C:
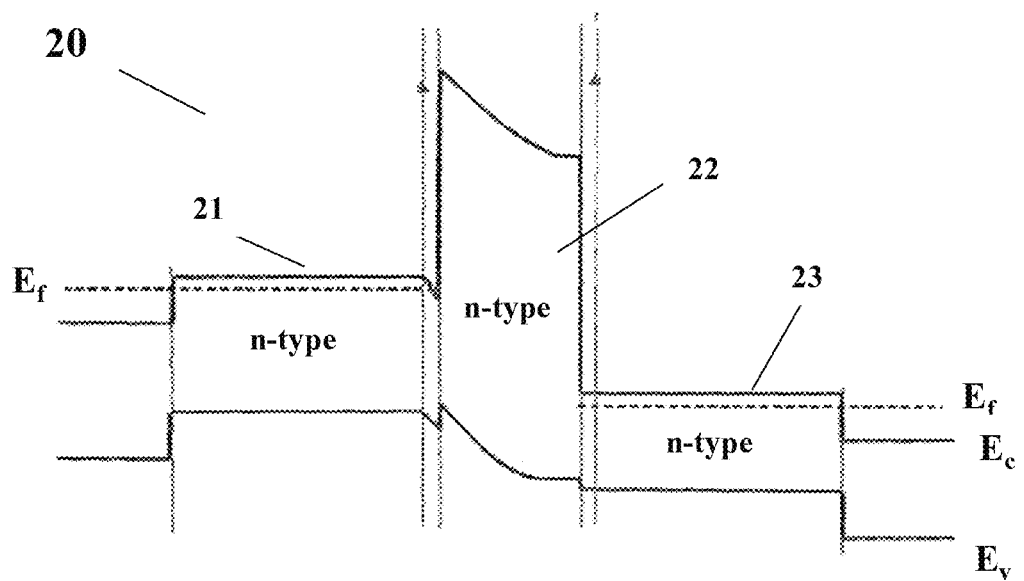

FIGS. 1A, 1B and 1C are schematic self-explanatory illustrations of two conventional dual band photodetector configurations generally known in the art.

FIG. 1A is a dual band bi-polar photodetector 10, such as that described in Ref. [1] which includes three semiconductor layers 11, 12 and 13 with n-type, p-type and n-type dopings, respectively. The top and bottom n-type doped semiconductor layers 11 and 13 are coupled at opposite sides of a p-type doped layer 12 thereby forming depletion regions, and the n-type layers and their band-gaps are adjusted for absorbing radiation in respectively first and second wavelength bands. Accordingly the bi-polar photodetector 10 defines a back to back arrangement of photodiodes sensitive to different wavelengths. As discussed above, this type of arrangement can yield significant G-R dark current since the photon absorbing regions or at least parts thereof are depleted near the p-n junctions.

FIG. 1B illustrates the valence and conduction band profiles of the detector in FIG. 1A when subjected to a forward or a reverse bias, chosen according to which wave length band is to be detected. The photon absorbing layers for both wavelength bands are n-type and they are separated by a thinner p-type layer with an even larger band gap. The band edges vary smoothly with no sudden steps or discontinuities that might block the free flow of minority carriers (holes) out of the photon absorbing layers.

FIG. 1C illustrates in self-explanatory manner the energy band structure of a dual band uni-polar photodetector 20, such as that described in U.S. Pat. No. 8,004,012 which includes three semiconductor layers 21, 22 and 23 which are all doped n-type. The valence and conduction energy bands and the Fermi levels (with the device under bias) are illustrated across the layers 21, 22 and 23 of the device. The band-gaps of the n-type doped semiconductor layers 21 and 23 are adjusted for absorbing light in respectively first and second wavelength bands. Another n-type doped semiconductor layer 22 with a large band gap is located between the layers 21 and 23 and serves as a barrier layer. In this example the conduction band exhibits a large discontinuity that blocks the flow of electrons, while the valence band is relatively smooth allowing the free flow of holes across the structure.

Uni-polar photodetector 20 of the type illustrated in FIG. 1C may be configured to yield lower G-R dark currents than the level of G-R currents obtainable from bi-polar devices such as the design 10 illustrated in FIG. 1A, and are therefore superior to bi-polar devices in that sense. However, in some implementations (e.g. when the unipolar photodetector is adapted to sense certain particular wavelength ranges and/or configured with particular semiconductor materials), it might be difficult to properly passivate certain surfaces of the photo-detection device, and thus the operation of the device might be impaired due to surface currents. For example, a p-type version of the device shown in FIG. 1C (for this version, the picture as shown must be inverted, as described in U.S. Pat. No. 8,004,012, so all layers are p-type and the barrier is in the valence band) made with III-V semiconductor superlattice materials often has large minority carrier diffusion lengths but the materials are very difficult to passivate (using an ex-situ passivation treatment). Conversely, in an n-type version of the device shown in FIG. 1C where the barrier layer is made with a III-V semiconductor material for which a suitable passivation treatment is known, but where a type II superlattice is used for at least one of the photon absorbing layers, the minority carrier diffusion lengths can, in some instances, be too small [4].

Figure 2:
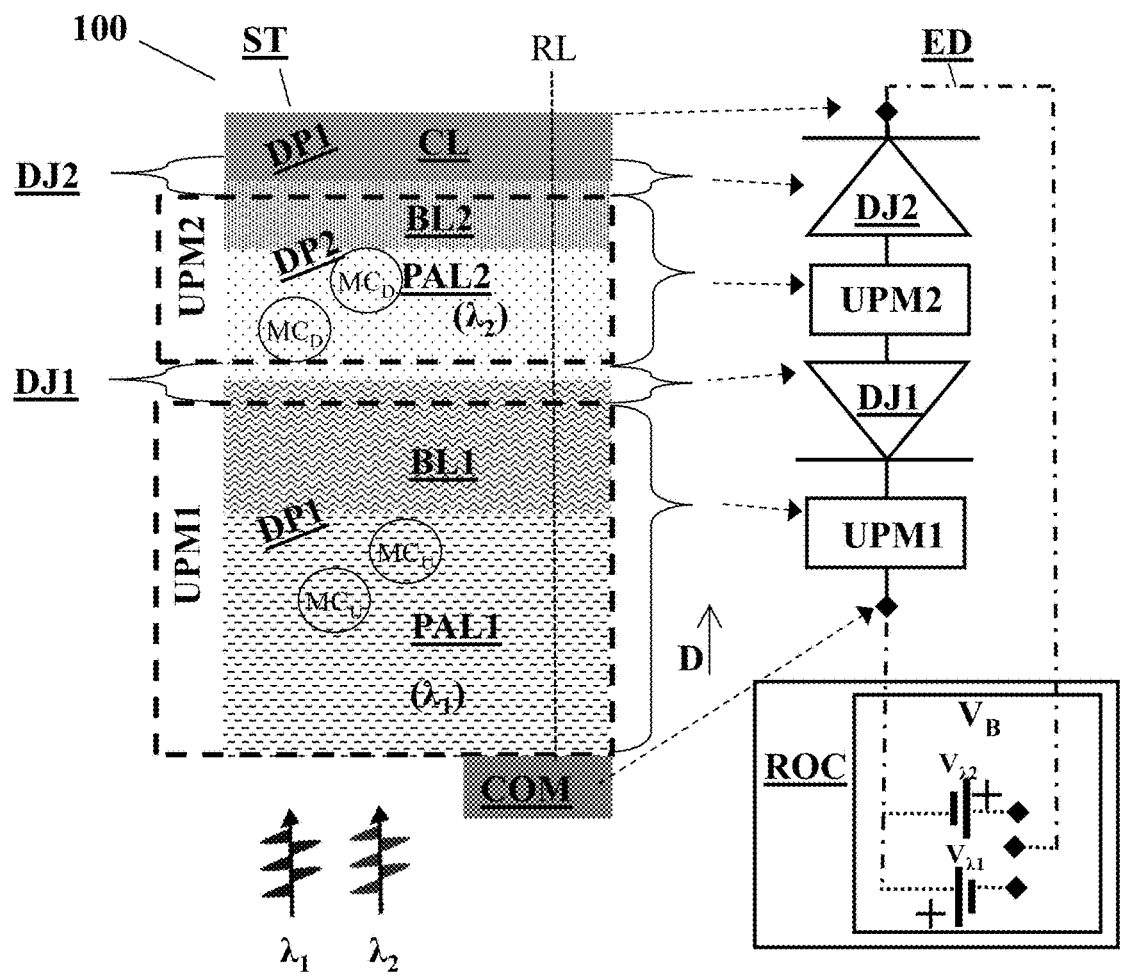
FIG. 2 is a schematic illustration showing the configuration and layer structure of a novel dual band photodetector 100 according to an embodiment of the present invention.

Reference is now made to FIG. 2 illustrating a layer structure ST of a novel dual band photodetector 100 according to an embodiment of the present invention. The photo detector 100 includes a stack of semiconductor layers defining a first and a second unipolar photosensitive module, UPM1 and UPM2, of respectively opposite doping polarities, DP1 and DP2, and a contact layer CL which may include a metal material and/or a semiconductor material having doping polarity opposite to that of the second UPM UPM2; The second UPM UPM2 of the second doping polarity DP2 is stacked/located upon the first UPM UPM1 of the first doping polarity DP1 along a certain layer direction D thereby forming a first diode junction DJ1 (p-n diode junction) between the first and second UPMs. The contact layer CL, being metal or a semiconductor of doping polarity DP1, is stacked/located on the second UPM UPM2 of the second doping polarity DP2 thereby forming a second diode junction DJ2 (p-n diode junction or a Schottky junction) between the second UPM UPM2 and the contact layer CL.

FIG. 2 also shows an electrical diagram ED illustrating the electrical connection of the photosensitive and electrical and components UPM1, DJ1, UPM2, and DJ2, which are implemented by the layer structure ST of the photodetector 100, to readout circuit ROC which may be optionally connectable to the photodetector 100 from the one side via the contact layer CL and via another electrical contact COM from the other side, which may be a common contact, commonly connected to a plurality of pixels of the photodetector.

According to the present invention the first and second UPMs, UPM1 and UPM2, are respectively adapted for sensing radiation of different first and second wavelengths ranges $\lambda_1$ and $\lambda_2$. This is achieved by proper configuration of the energy band gaps in the respective photon absorbing layers PAL1 and PAL2 of the first and second UPMs such that their band-gaps correspond to the minimal energy of photons in the respective first and second wavelength ranges to be absorbed thereby.

The first and second diode junctions DJ1 and DJ2 are configured (e.g. by proper configuration of the energy band structure and doping in the vicinity of the junctions DJ1 and DJ2) to have respectively opposite conduction directions to thereby enable selective sensing of electrical signals associated with said first and second wavelengths ranges.

More specifically, as illustrated in the electrical diagram ED in the figure, the conduction direction of the first diode junction DJ1 is opposite to the certain direction D and the conduction direction of the second diode junction DJ2 is along the certain direction D. Upon application of bias voltage $V_B$ in the direction D across the layer structure ST, namely applying the voltage $V_{\lambda 1}$, the second diode junction DJ2 will be under forward bias and would therefore conduct (i.e. would effectively short circuit), while the first diode junction DJ1 would be under a reverse bias. However, although the first diode junction DJ1 is not a photodiode junction, (namely there is no absorption of light in its depletion region that can contribute to the signal, because the band gap of the barrier layer BL1 is too large), under the reverse bias it will still conduct current in response to absorption of photons in the photon absorbing layer PAL1 of the first UPM UPM1. This is because minority carriers $MC_U$ of a first charge polarity are created in response to the absorption of radiation of the first wavelength range λ1 by the first UPM UPM1 (i.e. in the photon absorbing layer PAL1), and the application of the reverse bias voltage $V_{\lambda 1}$ to the first diode junction DJ1 (voltage along the direction D) attracts those excess minority carriers $MC_U$ and operates to remove them from the first UPM UPM1 across the diode. In other words, under the bias voltage $V_{\lambda 1}$, when the first UPM UPM1 is subjected to the radiation in the first wavelength range λ1, it generates and supplies the minority carriers $MC_U$ to the depletion region of the diode junction DJ1 thereby allowing the first diode junction DJ1 to pass a photocurrent associated with the absorption of the radiation of the first wavelength range λ1 so that a first electrical signal indicative of this photocurrent with magnitude corresponding to the intensity of the absorbed radiation is conducted across the first diode junction DJ1. Under this voltage $V_{\lambda 1}$ the second diode junction DJ2 is under forward bias and is conductive, therefore the total current in the circuit ED corresponds to the photocurrent from the first UPM UPM1 (λ1 photocurrent).

It is understood that the diode junctions DJ1 and DJ2 are not photodiode junctions at least in the sense that the energy band-gap within their depletion regions is configured to be sufficiently high to prevent absorption of radiation in the respective wavelength ranges λ1 and λ2 thereat that can contribute to the signal. This may be achieved for example by configuring the barrier layers BL1 and BL2 of the respective first and second UPMs, UPM1 and UPM2, to have sufficiently high energy band-gaps, at least higher than the energy of photons of the wavelength ranges λ1 and λ2, and preferably much higher in order to efficiently suppress dark G-R currents.

Nonetheless, as will be further discussed below, the barrier layers BL1 and BL2 are configured such the energy bands conducting minority carriers in their respective UPMs, UPM1 and UPM2, are smooth (e.g. free of abrupt changes that could block the flow), so that minority carriers from the respective UPMs, UPM1 and UPM2, can flow towards and then across the respective barrier layers BL1 and BL2. For instance, in an n-type UPM, the valence energy band of the barrier layer band BL and the valence energy band of the photon absorbing layer PAL are made to have roughly the same energy so that holes (being the minority carriers in the n-type UPM) can pass freely across the barrier layer BL. Vice-versa in a p-type UPM, the conduction band energy of the barrier layer BL and the conduction band energy of the photon absorbing layer PAL are made to have roughly the same energy so that electrons (being the minority carriers in the p-type UPM) can pass across the barrier layer BL.

Sensing radiation of the second wavelength range λ2 is possible with the photodetector 100 by reversing the bias voltage $V_B$, setting it to $V_{\lambda 2}$. As illustrated in the electrical diagram ED in the figure, the conduction direction of the second diode junction DJ2 is along the direction D. Upon application of bias voltage $V_B$ across the layer structure ST opposite to the direction D, the first diode junction DJ1 will be under forward bias and will therefore conduct (i.e. would effectively short circuit), while the second diode junction DJ2 would be under reverse bias. Similarly as described above with respect to the first diode junction DJ1, the second diode junction DJ2 (although not being a photodiode junction), will, under the reverse bias. conduct in response to absorption of photons in the photon absorbing layer PAL2 of the second UPM UPM2. This is because minority carriers $MC_D$ of a second charge polarity (opposite to the first charge polarity of the minority carriers $MC_U$) are created in the photon absorbing layer PAL2 of the second UPM UPM2 in response to absorption of radiation of the second wavelength range λ2. The application of the reverse bias voltage $V_{\lambda 2}$ to the second diode junction DJ2 (voltage opposite to the direction D) attracts those excess minority carriers $MC_D$ and operates to remove them from the second UPM UPM2 and pass them across the diode junction DJ2. In other words, under the bias voltage $V_{\lambda 2}$, when the second UPM UPM2 is subjected to the radiation in the second wavelength range λ2, it generates and supplies the minority carriers $MC_D$ to the depletion region of the diode junction DJ2 thereby allowing the second diode junction DJ2 to pass photocurrent associated with the absorption of the radiation of the second wavelength range λ2 so that a second electrical signal indicative of this photocurrent with magnitude corresponding to the intensity of the absorbed radiation is conducted across the second diode junction DJ2. Under this voltage $V_{\lambda 2}$ the first diode junction DJ1 is under forward bias and is conductive, therefore the total current in the circuit ED corresponds to the photocurrent from the second UPM UPM2 (λ2 photocurrent).

Thus, as illustrated in the figure, the layer structure ST of the dual band photodetector 100 of the invention includes:

i. A first photon absorbing layer PAL1 doped with a certain first doping polarity DP1 (e.g. p-type) and defining a first energy band gap adapted for absorbing photons with energy of a first wavelength band λ1;

ii. A first barrier layer BL1 wherein at least a first region thereof, which interfaces with the first photon absorbing layer, is doped with the same certain doping polarity DP1 as the first photon absorbing layer PAL1 such that a depletion region is not formed at the region between them. The barrier layer BL1 is typically configured with a large energy band gap (e.g. much higher than the first energy band gap of the first photon absorbing layer in order to suppress G-R processes from the depletion region of the first diode junction DJ1 and thereby yield diffusion limited dark current from the first UPM UPM1).

iii. A second photon absorbing layer PAL2 doped with a doping polarity DP2 (e.g. p-type) that is opposite to the doping polarity DP1 of the first UPM UPM1. Accordingly the first diode junction DJ1 is formed between the first and the second UPMs (between the barrier layer BL1 of the first and the photon absorbing layer PAL2 of the second). The second photon absorbing layer PAL2 is configured to have a second energy band gap that is adapted for absorbing photons with energy of a second wavelength band λ2.

iv. A second barrier layer BL2 wherein at least a first region thereof, which interfaces with the second photon absorbing layer PAL2, is doped with the same certain doping polarity DP2 as the second photon absorbing layer PAL2 such that a depletion region is not formed at the region between them. The barrier layer BL2 is typically configured with a large energy band gap (e.g. much higher than the second energy band gap of the second photon absorbing layer in order to suppress G-R processes from the depletion region of the second diode junction DJ2 and thereby yield diffusion limited dark current from the second UPM UPM2), and v. Electrical contact layer CL coupled to the second barrier layer BL2. The electrical contact layer comprises metal materials and/or semiconductor materials doped with doping polarity DP1 opposite to the doping polarity DP2 of the second UPM UPM2. Accordingly the second diode junction DJ2 is formed (as a Schottky junction or an n-p junction) between the second UPM UPM2 and the contact layer CL (e.g. between the barrier layer BL2 and the contact layer CL.

To this end, the first photon absorbing layer PAL1 and the first barrier layer BL1 are the functional layers of the first UPM UPM1, while the second photon absorbing layer PAL2 and the second barrier layer BL2 are the functional layers of the second UPM UPM2.

According to some embodiments of the present invention at least one of the layers constituting each of the diode junctions DJ1 and DJ2 is a barrier layer (e.g. BL1 and/or BL2) of one of the unipolar devices UPM1 and UPM2, so that the depleted regions of the diode junctions DJ1 and DJ2 accommodate the large energy band-gap of a barrier layer, so that G-R currents are suppressed from the diode junction. To this end in various implementations the dark current from the photodetector 100 is diffusion limited in the sense that it is mostly composed of diffusion current and includes almost no or negligible G-R currents.

As indicated above, the photodetector configuration of the present invention utilizes the two UPMs of different, i.e. opposite, doping polarities to sense electromagnetic radiation of different respective wavelength bands. It should also be noted that the configuration of the photodetector of the present invention is distinct from conventional n-p-n or p-b-p dual band photodetectors, which are based on a back to back arrangement of photodiodes sensitive to different wavelengths (such as shown in FIGS. 1A and 1B), at least in that both photon absorbing layers in the conventional (e.g. back to back) photodiode devices have the same doping polarity whereas in the present invention the two photon absorbing layers have opposite doping polarities.

Reference is made to FIGS. 3A to 3D which are schematic illustrations 300A 300B, 300C and 300D of the energy band structure of four configurations of a photodetector device 100 illustrated in FIG. 2 with various configurations of the doping polarities of the semiconductor layers of the photodetector 100 according to different embodiments of the present invention. Illustrations 300A 300B, 300C and 300D show the conduction energy band $E_C$, the valence energy band $E_V$, and the Fermi level $E_F$ along the cross-section line RL which is illustrated in FIG. 2 passing across the layers: PAL1, BL1, PAL2, BL2 and CL of the structure ST of the photodetector 100, when the latter is under zero bias voltage (as can be seen from the flat Fermi level $E_F$ across the layers).

Figure 3A:
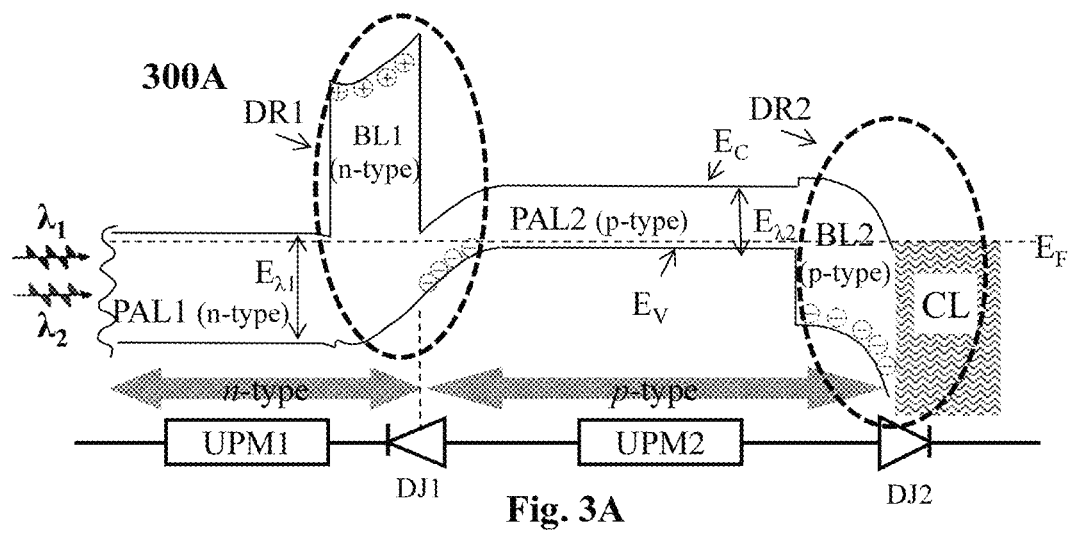
FIGS. 3A to 3D are schematic illustrations showing the energy band structure of photodetector devices configured according to several embodiments of the present invention.
Figure 3B:
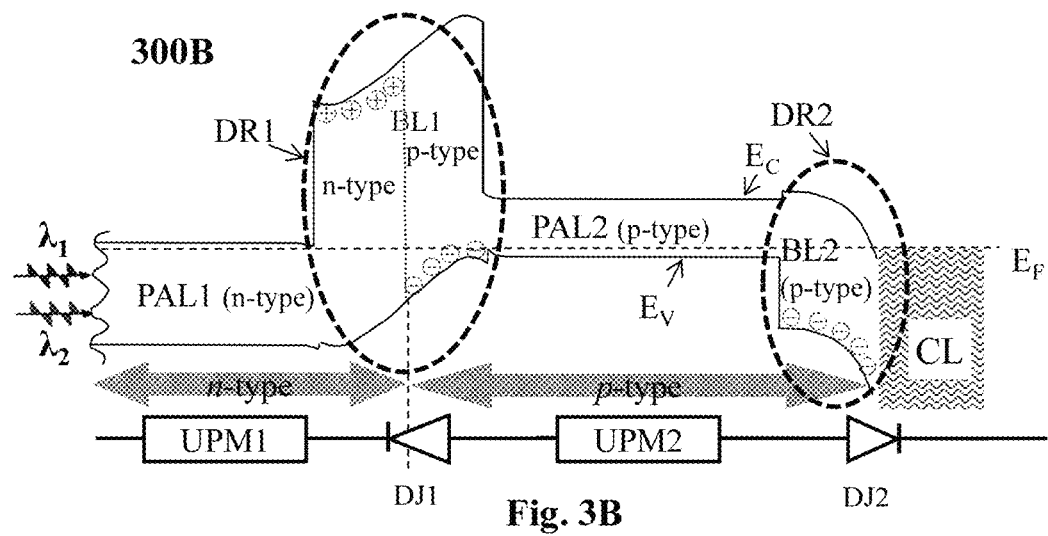
Figure 3C:
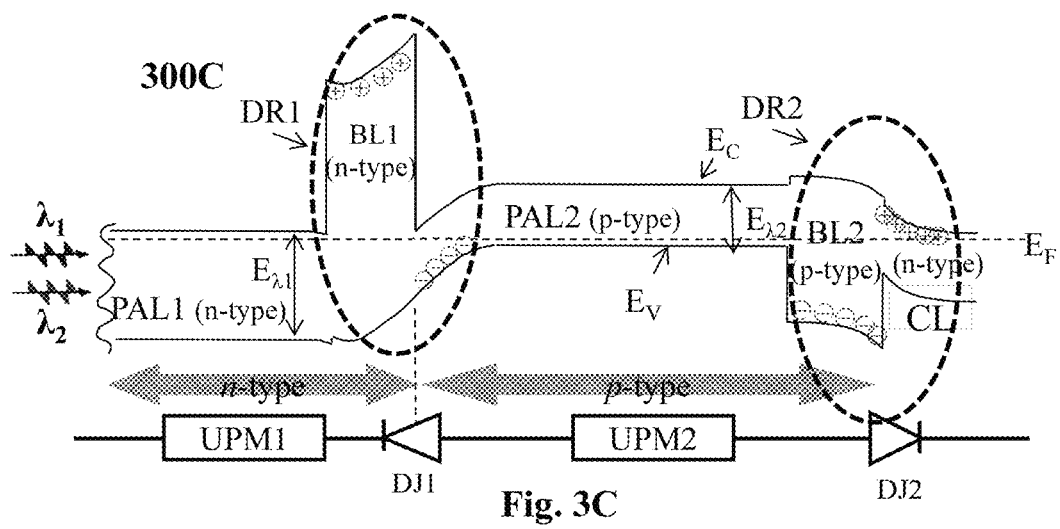

FIGS. 3A, 3B and 3C illustrate the energy bands of photodetector devices according to three embodiments, 300A, 300B and 300C, of the present invention in which the doping polarity DP1 of the first UPM UPM1 is n-type, the doping polarity of the second UPM UPM2 is p-type, and the contact layer CL includes a metal layer in FIGS. 3A and 3B or an n-type semiconductor in FIG. 3C. Thus the minority carriers of the first UPM UPM1 are holes (the majority carriers are electrons) and the minority carriers of the second UPM UPM2 are electrons (the majority carriers are holes).

To this end, the first UPM UPM1 is configured such that its conduction energy band $E_C$, which is the energy band in which the majority carriers (electrons) of the first UPM UPM1 may flow, is not continuous. More specifically the first barrier layer (its semiconductor material composition, doping concentration, and/or width) is configured such that its conduction band energy $E_C$ is much higher than the conduction band energy $E_C$ in the photon absorbing layer PAL1 of the first UPM UPM1, thereby defining an energy barrier in the conduction band (in the energy band conducting the majority carriers) preventing the majority carriers (electrons) of the first UPM from flowing across the first barrier layer BL1. This provides that the majority carriers (electrons) in the first UPM cannot pass across the first barrier layer BL1 and cannot conduct current between first and second UPMs UPM1 and UPM2. Nevertheless, the first UPM UPM1 is configured such that its minority carriers (holes) can pass from the first photon absorbing layer PAL1 across the first barrier layer BL1 and thus provide that minority carriers (holes) that are created, e.g. in response to the absorption of photons in the photon absorbing layer PAL1 of the first UPM UPM1, can conduct current between the first and second UPMs UPM1 and UPM2. This is achieved by the configuration of the first UPM UPM1 such that its valence energy band $E_V$, which is the energy band in which its minority carriers (holes) may flow, is essentially continuous (contains no step that would block the free flow of minority carriers (holes) into the barrier layer BL1). More specifically the first barrier layer BL1 (its semiconductor material composition, doping concentration, and/or width) is configured such that its valence energy band $E_V$ is at about the same height (energy) as the valence band energy $E_V$ of the photon absorbing layer PAL1 of the first UPM UPM1, thereby defining a substantially smooth valence energy band (the energy band conducting the minority carriers is made smooth) allowing the minority carriers (holes) of the first UPM to flow into and across the first barrier layer BL1. In this regard, the first photon absorbing layer PAL1 is configured such that the energy band gap $E_{\lambda 1}$ between its valence and conduction bands, $E_V$ and $E_C$, matches the energy of photons of the first wavelength band $\lambda 1$ to be detected by the photodetector 100, such that photons of this wavelength range can be absorbed by the first photon absorbing layer PAL1 to create minority carriers of the first UPM UPM1, which can follow and conduct current between the first and second UPMs, UPM1 and UPM2, provided that a bias voltage $V_B$ with the correct electrical polarity is applied to the photodetector 100.

The second UPM UPM2 is configured such that its valence band energy $E_V$, which is the energy band in which the majority carriers (holes) of the second UPM UPM2 may flow, is not continuous. More specifically the second barrier layer BL2 (its semiconductor material composition, doping concentration, and/or width) is configured such that its valence band energy $E_V$ is much lower than the valence band energy $E_V$ of the second photon absorbing layer PAL2 of the second UPM UPM2. This defines an energy barrier in the valence band $E_V$ (in the energy band conducting the majority carriers in the second UPM) preventing the majority carriers (holes) of the second UPM from flowing across the second barrier layer BL2. This provides that the majority carriers (holes) in the second UPM UPM2 cannot pass across the second barrier layer BL2 and cannot conduct current between the second UPM UPM2 and the contact layer CL. Nevertheless, the second UPM UPM2 is configured such that its minority carriers (electrons) can pass from the second photon absorbing layer PAL2 across the second barrier layer BL2, and thus provide that minority carriers (electrons) of the second UPM UPM2 which are generated e.g. in response to the absorption of photons in the photon absorbing layer PAL2 of the second UPM UPM2, can conduct current between the second UPM UPM2 and the contact layer CL. This is achieved by the configuration of the second UPM UPM2 such that its conduction band energy $E_C$, which is the energy band in which its minority carriers (electrons) may flow, is essentially continuous (contains no step that would block the free flow of minority carriers (electrons) into the barrier layer BL2). More specifically the second barrier layer BL2 (its semiconductor material composition, doping concentration, and/or width) is configured such that its conduction band energy $E_C$ is at about the same height as the conduction band energy $E_C$ of the second photon absorbing layer PAL2 of the second UPM UPM2, thereby providing a substantially smooth conduction band energy (the energy band conducting the minority carriers is made smooth) across the second UPM allowing the minority carriers (electrons) of the second UPM UPM2 to flow into and across the second barrier layer BL2. The second photon absorbing layer PAL2 is configured such that the energy band gap $E_{\lambda 2}$ between its valence and conduction bands, $E_V$ and $E_C$, matches the energy of photons of the second wavelength band $\lambda 2$ which is to be detected by the photodetector 100. Accordingly, photons of this wavelength range can be absorbed by the second photon absorbing layer PAL2 to create minority carriers (electrons) of the second UPM UPM2, which can follow and conduct current to the contact layer CL, provided that a bias voltage $V_B$ with the correct electrical polarity is applied to the photodetector 100.

The first and second UPMs are respectively doped with opposite doping polarities to form a first depletion region DR1 at/near the interface between them. To this end the first and second UPMs, UPM1 and UPM2, are configured such that the energy bands at/near the interface between them are in the form of a diode junction DJ1 having its electric polarity (forward bias direction of the diode DJ1) directed from the second to the first UPM, from UPM2 to UPM1. This is a consequence of the ordering of the n- and p-type doping (i.e. n-type in UPM1 and p-type in UPM2). It should be noted that in the example of FIG. 3A the entire barrier layer BL1 of the first UPM UPM1 is doped with the same doping polarity (n-type) and opposite to that of the photon absorbing layer PAL2 of the second UPM UPM2 so that the diode junction DJ1 is formed at the interface between the barrier layer BL1 and the photon absorbing layer PAL2. In the example of FIG. 3B a first part of the barrier layer BL1, which is adjacent to the photon absorbing layer PAL1 of the first UPM, UPM1, is doped with one doping polarity (n-type), and another part thereof, which is adjacent to the photon absorbing layer PAL2 of the second UPM, UPM2 is doped with the opposite doping polarity, so that the diode junction DJ1 is formed within the first barrier layer BL1 (one may consider the part of the first barrier layer which is doped with the opposite doping polarity to be actually a part of the second UPM, UPM2, which has the same doping polarity).

The second UPM UPM2 and the contact layer CL are configured such that a second depletion region DR2 is formed at/near the interface between them. To this end the contact layer CL may be metal (as shown in 300A and 300B) or a semiconductor (as shown in 300C) where the semiconductor is doped with doping polarity (n-type) opposite to that of the second UPM UPM2 (p-type) such that the energy bands at/near the interface between them are in the form of a diode junction DJ2 having its electrical polarity (forward bias direction of the diode DJ2) directed from the second UPM UPM2 to the contact layer. This is a consequence of the ordering of the n- and p-type doping (i.e. p-type in UPM2 and n-type or metallic in the contact layer, CL).

Figure 3D:
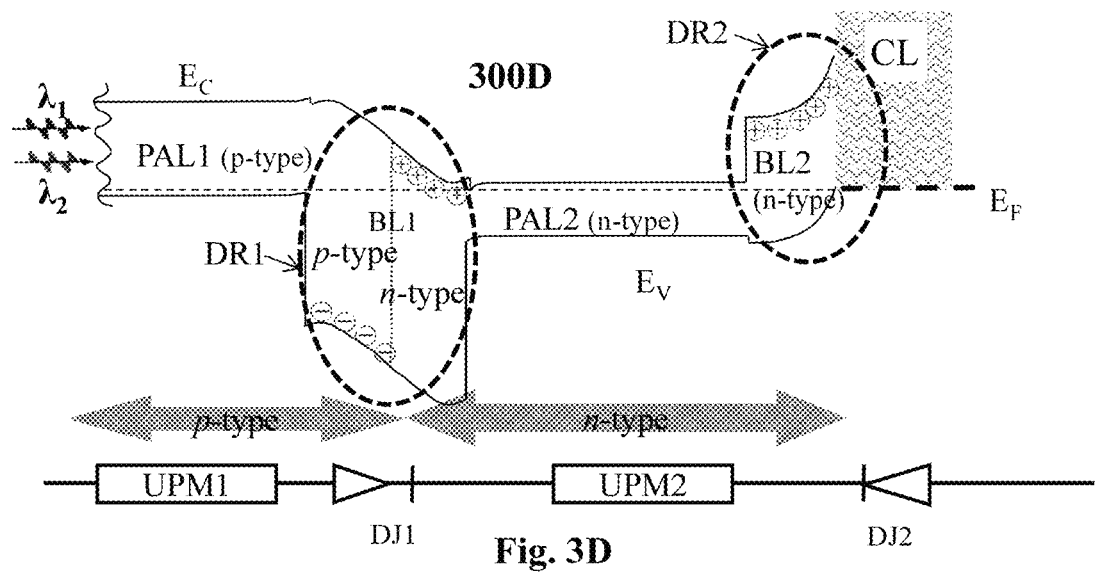

FIG. 3D illustrates the energy bands of a photodetector device according to an embodiment of the present invention in which the doping polarity DP1 of the first UPM UPM1 is p-type, the doping polarity of the second UPM UPM2 is n-type, and the contact layer CL includes a metal as shown, but could alternatively include a p-type doped semiconductor layer, analogous to the device with the opposite doping polarities shown in FIG. 3C. Accordingly, the minority carriers of the first UPM UPM1 are electrons (the majority carriers are holes) and the minority carriers of the second UPM UPM2 are holes (the majority carriers are electrons). The photodetector in this example is configured and operable with similar principles as the photodetectors described above with reference to FIGS. 3A, 3B and 3C, but has the opposite doping polarities.

More specifically, here the first UPM UPM1 is configured such that the energy band in which the majority carriers (holes) of the first UPM UPM1 may flow (here the valence band $E_V$), is not continuous. To this end the first barrier layer BL1 (its semiconductor material composition, doping concentration, and/or width) is configured such that this energy band ($E_V$) in which the majority carriers (i.e. holes) of the first UPM UPM1 conduct, is energetically much lower for the majority carriers than it is in the first photon absorbing layer PAL1 of the first UPM UPM1. Accordingly, this forms and an energy barrier for the majority carriers of the first UPM UPM1 preventing/suppressing their flow across the first barrier layer BL1. However although the majority carriers (holes) in the first UPM UPM1 cannot conduct current between the first and second UPMs UPM1 and UPM2, nevertheless the first UPM UPM1 is configured such that its minority carriers (electrons) can pass from the first photon absorbing layer PAL1 across the first barrier layer BL1. This is achieved by the configuration of the first UPM UPM1 such that the energy band thereof (here conduction energy band $E_C$) in which the minority carriers (electrons) can flow/conduct, is essentially continuous and relatively smooth in the transition between the first photon absorbing layer PAL1 and the barrier layer BL1 (this is achieved by proper configuration of the semiconductor material composition, doping concentration, and/or width of the first barrier layer BL1). Accordingly the minority carriers (here electrons) of the first UPM UPM1 can flow freely into and then across the first barrier layer BL1. The first photon absorbing layer PAL1 is configured such that the energy band gap $E_{\lambda 1}$ between its valence and conduction bands, $E_V$ and $E_C$, matches the energy of photons of the first wavelength band $\lambda 1$ to be detected by the photodetector 100. Accordingly absorption of photons of this wavelength range in the first photon absorbing layer PAL1 creates minority carriers (electrons) of the first UPM UPM1, which may flow across the first barrier layer BL1, and may conduct current between the first and second UPMs, UPM1 and UPM2, provided that a reverse bias voltage $V_B$ is applied to diode junction DJ1. The current conducted in this way is indicative of the photons of the first wavelength range $\lambda 1$ absorbed by the first photon absorbing layer PAL1.

The second UPM UPM2 is also configured such that the energy band, in which the majority carriers of the second UPM UPM2 (here electrons) may flow (here the conduction band $E_C$), is not continuous. Also here this may be achieved by proper configuration of the second barrier layer BL2 (its semiconductor material composition, doping concentration, and/or width) such that the energy band ($E_C$) conducting the majority carriers of the second UPM UPM2, is energetically much higher for the majority carriers than it is in the second photon absorbing layer PAL2 of the second UPM UPM2. This forms an energy barrier for the majority carriers of the second UPM UPM2 preventing/suppressing flow across the second barrier layer BL2. However, the second UPM UPM2 is configured such that the energy band thereof in which its minority carriers (holes) can flow/conduct (here valence band $E_V$), is continuous and relatively smooth in the transition between the second photon absorbing layer PAL2 and the second barrier layer BL2. Accordingly the minority carriers (here holes) can pass/conduct current from the second photon absorbing layer PAL2 to the contact layer CL across the second barrier layer BL2. The second photon absorbing layer PAL2 is configured such that the energy band gap $E_{\lambda 2}$ between its valence and conduction bands, $E_V$ and $E_C$, matches the energy of photons of the second wavelength band $\lambda 2$ to be detected by the photodetector 300D. Accordingly, absorption of photons of this wavelength range $\lambda 2$ in the second photon absorbing layer PAL2 creates minority carriers (holes) of the second UPM UPM2. The latter, provided that a reverse bias voltage $V_B$ is applied to the second diode junction DJ2, can flow across the second barrier layer BL2, to the contact layer CL and may conduct current indicative of the number of photons of the second wavelength range $\lambda 2$ absorbed by the second photon absorbing layer PAL2.

Also in this example the first and second UPMs are respectively doped with opposite doping polarities so as to form a diode junction DJ1 (a first depletion region DR1) at/near the interface between them with its electric polarity (forward bias direction of the diode DJ1) directed from the first to the second UPM (from UPM1 to UPM2), and the contact layer CL is a metal (but could also be a semiconductor doped with the doping polarity opposite to the second UPM UPM2) to form diode junction DJ2 (with a second depletion region DR2) with its electrical polarity (i.e. conduction direction) directed from the contact layer CL to the second UPM UPM2 (the shaded region above or below the Fermi level, $E_F$, in the contact layer CL in FIGS. 3A, 3B and 3D depicts the carriers in the metal which correspond to the minority carriers of the photon absorbing layer PAL2 of the second UPM UPM2; in FIGS. 3A and 3B they are electrons and in FIG. 3D they are holes (empty electron states)). In this example, FIG. 3D, the diode junction DJ1 is formed within the first barrier layer BL1, although it should be understood that in some embodiments it is formed at the interface between the first barrier layer BL1 and the second photon absorbing layer PAL2, as in the embodiment of FIG. 3A only with the inverse doping polarities of the layers. The diode junctions DJ1 and DJ2, enable the selective operation of the photodetector, by applying the bias voltage $V_B$ in one or an opposite direction, to selectively sense the radiation of either the first or the second wavelength ranges, $\lambda 1$ and $\lambda 2$, respectively.

Figure 3E:
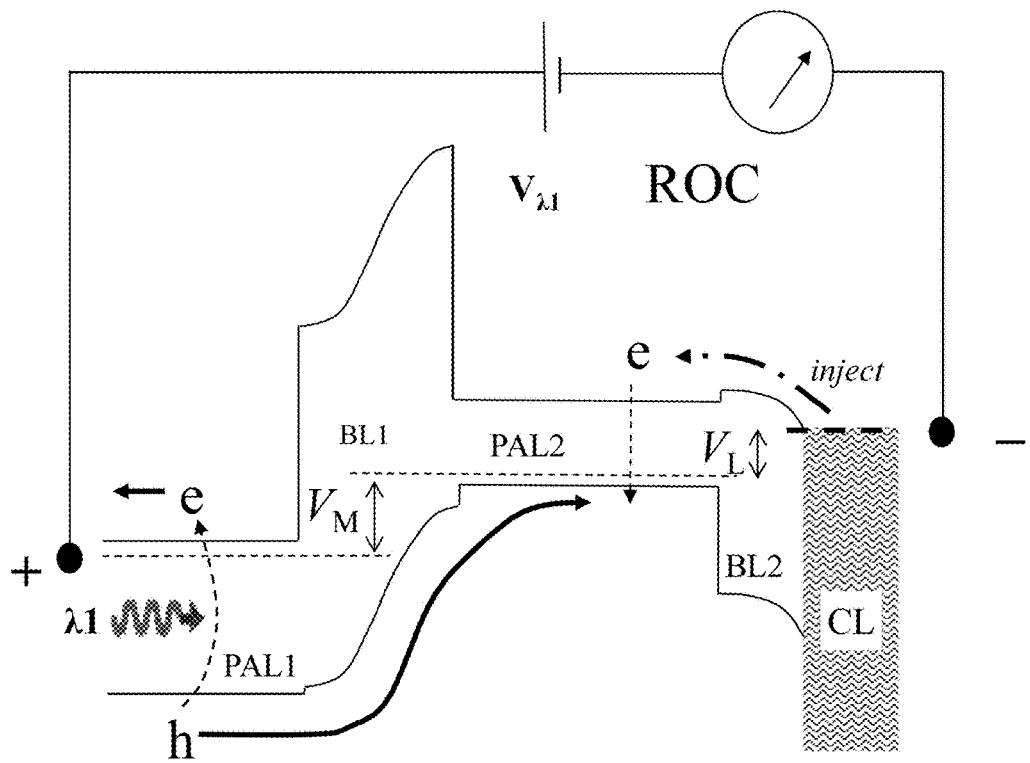
FIGS. 3E and 3F schematically illustrate the energy band structure of a photodetector configured according to an embodiment of the present invention and the dual band operation thereof, illustrated by the flow of photocurrent across the photodetector 100 upon application of bias voltages of respectively opposite electrical polarities.
Figure 3F:
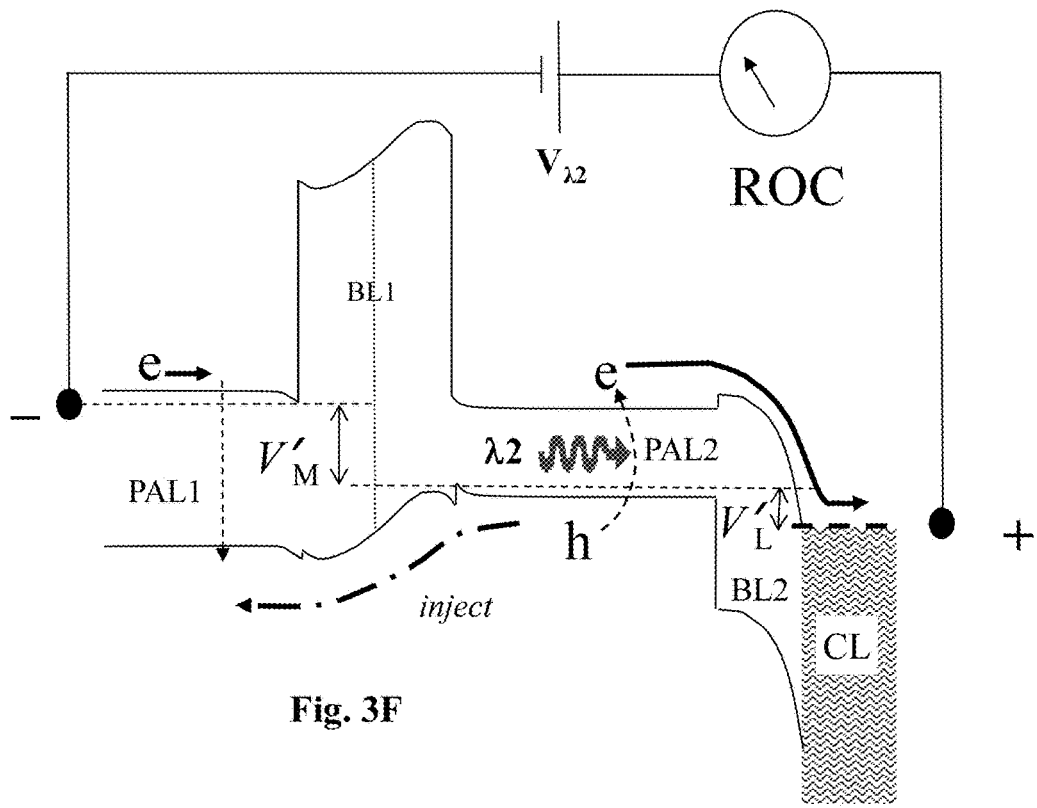

Reference is now made to FIGS. 3E and 3F which schematically illustrate the energy band structure of the photodetector 100 and the flow of photocurrent across the photodetector 100 upon application of bias voltages $V_{\lambda 1}$ and $V_{\lambda 2}$ of respectively opposite electrical polarities for selectively sensing radiation in the first and second wavelength ranges, $\lambda 1$ and $\lambda 2$, respectively. In these examples the energy bands illustrated are similar to those of the photodetector 100 described above with reference to FIG. 3B. However it should be understood, and would readily be appreciated by those versed in the art that the photodetector 100 configured according to FIG. 2 and FIGS. 3A, 3C and 3D described above operate with similar principles as those described below with reference to FIGS. 3E and 3F, with appropriate modifications of the voltage polarities and the polarities of minority and majority carriers as necessary in accordance with the doping polarities of the different semiconductor layers in these embodiments.

FIG. 3E shows the photodetector 100 of FIG. 3B when voltage $V_{\lambda 1}$ is applied thereto such that the diode junction DJ1 is under reverse bias voltage $V_M$ and the diode junction DJ2 is under forward bias voltage $V_L$. $V_L$ and $V_M$ generally satisfy that $V_{\lambda 1} = V_L + V_M$, and generally $V_L$ is much smaller than $V_M$. In this mode of operation the photodetector 100 operates to detect radiation in the wavelength range $\lambda 1$. A photon in this wavelength range $\lambda 1$ absorbed by the photon absorbing layer PAL1 causes generation of electron-hole pairs there. The electron is attracted to the positive electric pole adjacent to the first photon absorbing layer PAL1. The hole, being the minority carrier of the first UPM UPM1 (which is in this example n-type doped), can pass across the first barrier layer BL1, as described above, to cross the depletion region DR1 of the first diode junction DJ1, which is under reverse bias, and reach the second photon absorbing layer PAL2 of the second UPM UPM2, in which it is actually a majority carrier (since in this example the second UPM UPM2 is doped p-type). This provides an excess of majority charge carriers (holes) in the second photon absorbing layer PAL2, causing injection of an electron (minority carrier of the second UPM UPM2) from the negative electric pole (which is coupled to the contact layer CL) to pass across the second barrier layer (it can pass since it is a minority carrier of the second UPM UPM2) to reach the second photon absorbing layer and cancel the excess charge formed there and at the same time, maintain current continuity across the device from one electrical pole to the other. Accordingly, photocurrent indicative of the wavelength range $\lambda 1$ flows between the positive and negative electric poles and through the external read out circuit ROC.

Indeed, in this mode of operation, photons (e.g. of wavelength range $\lambda 2$) absorbed in the second photon absorbing layer PAL2 do not contribute to the photocurrent. This is because the electrons of the electron-hole pairs generated in the second photon absorbing layer PAL2 in response to such photon absorption, are actually majority carriers of the first UPM UPM1, which cannot pass across the first barrier layer BL1 of the first UPM UPM1 to reach the positive electric contact. Similarly, the holes of the electron-hole pairs generated in the second photon absorbing layer PAL2 in response to such photon absorption, are actually majority carriers of the second UPM UPM2, which cannot pass across the second barrier layer BL2 of the second UPM UPM2 to reach the negative electric contact. These electron hole pairs will eventually recombine.

FIG. 3F shows the photodetector 100 of FIG. 3B when voltage $V_{\lambda 2}$ is applied thereto such that the diode junction DJ1 is under forward bias voltage $V'_M$ and the diode junction DJ2 is under reverse bias voltage $V'_L$. $V'_L$ and $V'_M$ generally satisfy the relation $V_{\lambda 2} = V'_L + V'_M$ and generally $V'_M$ is much smaller than $V'_L$ (even though not shown as such in FIG. 3F for reasons of clarity). In this mode of operation the photodetector 100 operates to detect radiation in the wavelength range $\lambda 2$. Photons of this wavelength range are absorbed by the second photon absorbing layer PAL2 causing generation of electron-hole pairs there. The electron is attracted to the positive electric pole, which is now the contact layer CL. As discussed above, the electron can pass the second barrier layer BL2 to cross the depletion region DR2 and reach the contact layer CL since it is the minority carrier of the second UPM UPM2 (which in this example is p-type doped). The hole, which is the majority carrier of the second UPM UPM2, is actually a minority carrier of the first UPM UPM1, so it can pass across the first barrier layer BL1 and reach the first photon absorbing layer PAL1 of the first UPM UPM1, which is connected to the negative electric pole. Accordingly, electrons from the negative electric pole are attracted/injected from the negative electric pole to the first photon absorbing layer PAL1 to cancel the access electric charge and maintain current continuity across the device from one electrical pole to the other. Accordingly, photocurrent indicative of the wavelength range λ2 flows between the positive and negative electric poles and through the external read out circuit ROC.

Indeed, in this mode of operation, photons (e.g. of wavelength λ1 absorbed in the first photon absorbing layer PAL1) do not contribute to the photocurrent. This is because the electrons of the electron-hole pairs generated in the first photon absorbing layer PAL1 in response to such photon absorption, are actually majority carriers of the first UPM UPM1, which cannot pass across the first barrier layer BL1 of the first UPM UPM1 to reach the positive electric contact. Similarly, the holes of the electron-hole pairs generated in the first photon absorbing layer PAL1 in response to such photon absorption, remain in the photon absorbing layer PAL1 of the first UPM UPM1 in order to maintain charge neutrality consistent with the chemical potential of this layer which is fixed by the negative electric pole. These electron hole pairs will eventually recombine.

Figure 4:
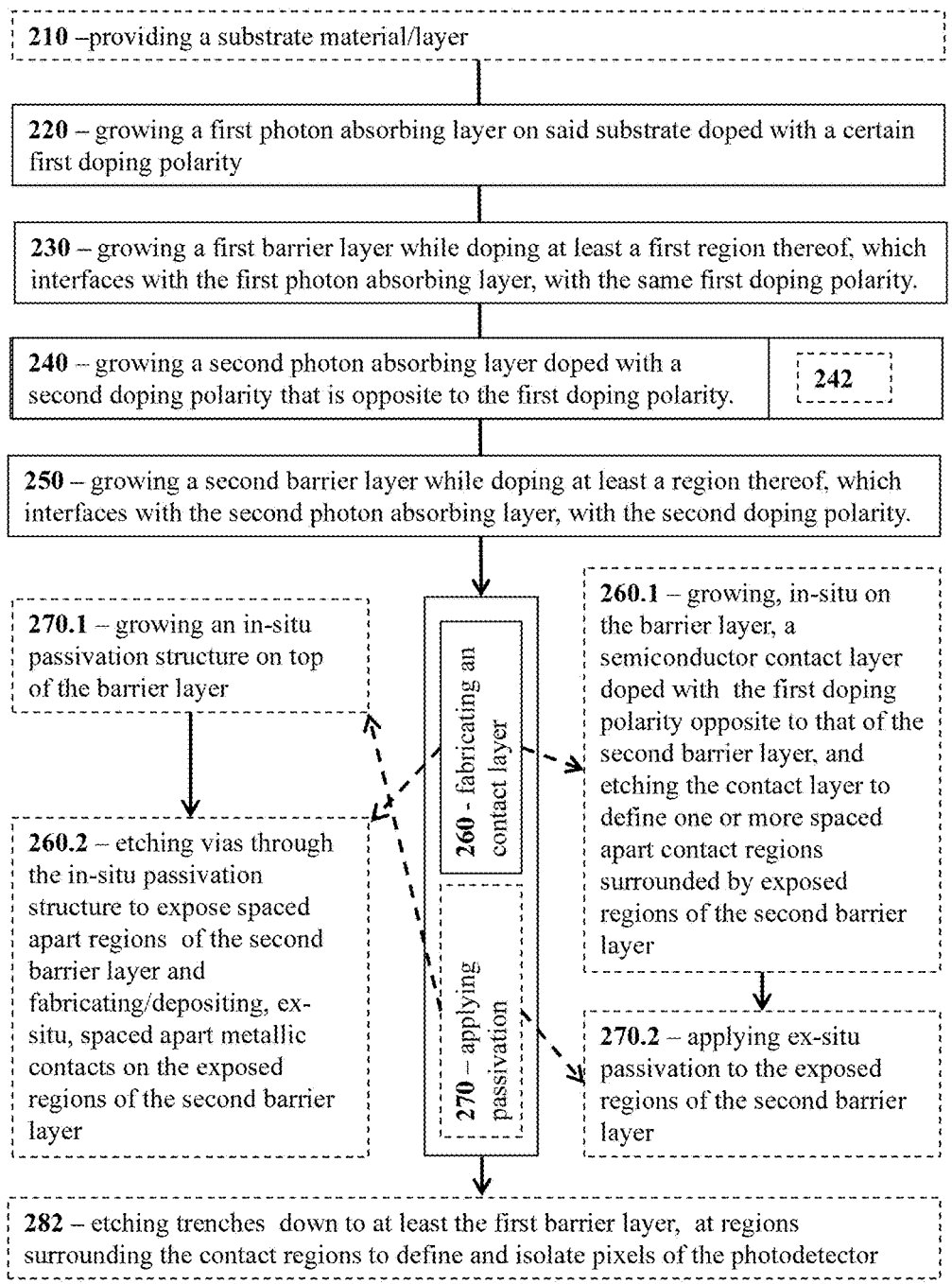
FIG. 4 is a flow chart 200 illustrating a method for fabricating a dual band photodetector 100 according to an embodiment of the present invention.

FIG. 4 is a flow chart 200 illustrating a method for fabricating a dual band photodetector 100 according to an embodiment of the present invention. Method 200 includes fabrication process operations/steps 210 to 282 (some of which are optional) described for example in the following:

Optional operation 210 includes the provision of a substrate material/layer (e.g. comprising a semiconductor substrate and/or buffer material layers) onto which to fabricate the layers of the photodetector 100.

Operation 220 includes fabricating/growing a first photon absorbing layer PAL1 (e.g. on said substrate) whereby the first photon absorbing layer PAL1 is doped with a certain first doping polarity DP1 (e.g. n-type) and wherein the material compositions (e.g. type II superlattice (T2SL)) used for fabrication of the first photon absorbing layer PAL1, the width of the first photon absorbing layer PAL1 and/or the doping polarity and the concentration of dopants is selected such that the first photon absorbing layer PAL1 has a first energy band gap suitable for absorbing photons with energy of a first wavelength band λ1 to be sensed by the photodetector 100. The first photon absorbing layer PAL1 may be for example a crystallized semiconductor layer grown by a semiconductor crystal growth machine/chamber (e.g. grown by epitaxial growth technique such as molecular beam epitaxy (MBE)).

Operation 230 includes fabricating/growing a first barrier layer BL1 (e.g. directly on top of the first photon absorbing layer PAL1) while doping at least a first region of the first barrier layer BL1, which interfaces with the first photon absorbing layer PAL1, with the same certain doping polarity DP1 as the first photon absorbing layer PAL1, to prevent formation of a depletion region in the first photon absorbing layer PAL1. The material compositions (e.g. T2SL or III-V alloy) used for fabrication of the barrier layer BL1, the width of the barrier layer BL1 and/or the concentration of dopants therein are selected such that a large energy band gap exists in the first barrier layer BL1 to suppress occurrence of G-R process within the first barrier layer BL1, which is depleted because all the dopants in said barrier layer are ionized (e.g. donors depicted by circles with a "plus" inside in e.g. FIG. 3A). In some embodiments this provides that the dark current from the first UPM UPM1 is diffusion limited (practically not including G-R currents) since G-R dark currents generally result from the occurrence of G-R processes generating charge carriers within a depletion region, which are then removed from the depletion region, due to the built-in electric field thereat, thereby causing the dark G-R current. Accordingly making the band-gap sufficiently high suppresses G-R processes from the depletion region with the first barrier layer BL1 and may provide that the dark current from the first UPM UPM1 is diffusion limited.

The first barrier layer BL1 may be for example a crystallized semiconductor layer grown by a semiconductor crystal growth machine/chamber (e.g. by epitaxial growth such as MBE).

It is noted that a region of the first barrier layer BL1, that is sufficiently distant from the interfaces between the first barrier layer BL1 and the first photon absorbing layer PAL1, may be doped with doping polarity DP2 opposite to DP1, thereby forming the first diode junction DJ1 within the first barrier layer. Alternatively the entire barrier layer BL1 may be doped with the same doping polarity DP1 and the diode junction DJ1 may be formed at the interface between it and the second photon absorbing layer PAL2.

Operation 240 includes fabricating/growing a second photon absorbing layer PAL2 (e.g. directly on top of the first barrier layer BL1) whereby the second photon absorbing layer PAL2 is doped with a doping polarity DP2 (e.g. p-type) that is opposite to the doping polarity DP1. Accordingly a first diode junction DJ1 is formed at the first barrier layer BL1 (e.g. within it, or at the interface between it and the second photon absorbing layer PAL2). The material compositions (e.g. T2SL) used for fabrication of the second photon absorbing layer PAL2, the width of the second photon absorbing layer PAL2 and/or the concentration of dopants therein are selected such that the second photon absorbing layer PAL2 has a second energy band gap that is adapted for the absorption of photons with the energy of a second wavelength range λ2. The second photon absorbing layer PAL2 may be for example a crystallized semiconductor layer (e.g. a T2SL material) grown using a semiconductor crystal growth machine/chamber (e.g. by epitaxial growth such as MBE).

Typically, according to some embodiments of the present invention the photodetector 100 is configured as a back illuminated photodetector such that the light (i.e. photons) to be sensed propagates across the photodetector 100 in the direction D from the first to the second photon absorbing layers (from PAL1 to PAL2). In this case, the second energy band gap of the second photon absorbing layer PAL2 is designed for absorbing wavelengths λ2 longer (and less energetic) than the first wavelength range λ1, so that when illumination propagates across the photodetector 100 in the direction D, the first photon absorbing layer PAL1 first absorbs the more energetic photons of the shorter first wavelength range λ1, while practically not absorbing the less energetic photons of the second wavelength range λ2 (since its energy band gap is higher than the energy of the λ2 photons). Accordingly, the latter, λ2 photons, continue to propagate towards the second photon absorbing layer PAL2 at which they can be absorbed.

Operation 250 includes fabricating/growing a second barrier layer BL2 while doping at least a first region of the second barrier layer BL2, which interfaces with the second photon absorbing layer PAL2, with the same doping polarity DP2 as the second photon absorbing layer PAL2, to prevent formation of a depletion region in the second photon absorbing layer PAL2. The material compositions (e.g. T2SL) used for fabrication of the barrier layer BL2, the width of the barrier layer BL2 and/or the concentration of dopants therein are selected such that a large energy band gap exists in second barrier layer BL2 to suppress occurrence of G-R process in the second barrier layer BL2 which is depleted because all the dopants in said barrier layer are ionized (e.g. acceptors depicted by circles with a "minus" inside in e.g. FIG. 3A), noting that G-R dark currents generally result from the occurrence of G-R processes that generate charge carriers within a depletion region, which are then removed from the depletion region by the built-in electric field thereat thus giving rise to the G-R dark current. Therefore making the band gap sufficiently high provides for suppressing G-R processes from the depletion region of the second diode junction DJ2 and may provide that the dark current from the second UPM UPM2) is diffusion limited (practically not including G-R current).

It is noted that a region of the second barrier layer BL2, which is sufficiently distant from the interface between the second barrier layer BL2 and the second photon absorbing layer PAL2 may be doped with doping polarity DP1 opposite to DP2, thereby forming the second diode junction DJ2 within the second barrier layer BL2. Alternatively, the entire barrier layer BL2 may be doped with the same doping polarity DP2 and the diode junction DJ2 may be formed at the interface between it and the contact layer CL.

Operation 260 is carried out for the fabrication of an electrical contact layer CL electrically coupled to the second barrier layer BL2. Also optional operation 270 may be performed for passivating the semiconductor structure ST (e.g. the second barrier layer BL2), in order to prevent/surface currents, which might deteriorate the photocurrent (photoelectric) signal(s) from the photodetector 100 particularly in cases when the photodetector is divided, or configured to define, distinct pixels, and/or when under-fill is to be used (e.g. to bind it to a silicon readout integrated circuit, prior to removal of most or all of the substrate by polishing). Passivation is particularly important in cases where the photodetector 100 includes more than one pixel (more than one light sensitive region (i.e. a plurality of pixels)), in order to suppress surface currents and reduce the cross conduction between the pixels. In cases where an under-fill material is to be applied in the space between the semiconductor structure ST and the read out circuit ROC this can often cause changes to the surface conduction properties of exposed regions of the structure ST such as exposed surface regions of the barrier layer BL2 so that free or mobile charges accumulate on the surface (e.g. after etching or depositing the contact layer to form separated pixelated structures). In this case the passivation provides for preventing/reducing surface current leakage between pixels of the photodetector 100.

Optionally according to some embodiments, particularly in embodiments in which the doping polarity DP2 of the second barrier layer BL2 is p-type operation 260 and optional operation 270 are carried out by first carrying out operation 270.1 for implementing in-situ passivation of the second barrier layer BL2 by growing an in-situ passivation structure ISPS thereon (e.g. while the device is still in the crystal growth chamber/machine), and then carrying out operation 260.2 to fabricate one or more metal contacts on the second barrier layer. A photodetector device 100 configured according to the present invention by carrying out operations 270.1 and 260.2 is schematically illustrated for example in self-explanatory manner in FIG. 5A.

More specifically in these embodiments operation 270.1 may be carried out for applying/fabricating an in situ passivation structure ISPS on top of the semiconductor structure/layers ST (e.g. on top of the second barrier layer BL2). This includes growing an in-situ passivation structure which may include one or more passivation layers (typically two passivation layers) grown in situ by the crystal growth machine/chamber (e.g. by epitaxial growth such as MBE), on top of the second barrier layer BL2. The growth of an in-situ passivation structure is particularly advantageous in cases where the second barrier layer BL2, is a p-type semiconductor layer (e.g. particularly in cases it is a p-type doped, type II superlattice layer). In this case conventional ex-situ passivation techniques, (i.e. which are performed outside the crystal growth chamber for example by using spinning or evaporation or plasma based chemical vapor deposition techniques to fabricate a surface coverage of a dielectric such as SU8, silicon dioxide or silicon nitride) are less effective and the use of the in-situ passivation provides high quality passivation of the surface and dramatically reduces current leakage across the surface of the second barrier layer (including after bonding to a silicon read out integrated circuit, injecting a glue under-fill, and polishing off most or all of the substrate). Fabricating/growing the in-situ passivation structure includes growing on top of the second barrier layer BL2 at least one crystallized passivation layer PL located on the second barrier layer BL and having a large energy band gap (e.g. larger than that of the second barrier layer BL2), and possibly fabricating an additional layer CAPL (cap layer) having a high density of surface states which forces pinning of the equilibrium Fermi level (EFL) at the top surface of the passivation structure ISPS at a specific energy within the energy band gap of the passivation layer PL thus preventing/reducing surface conduction (and reducing cross conduction between pixels). The grown passivation layer PL of the in-situ passivation structure may be doped with the same doping polarity DP2 as that of the barrier layer BL2. Then optionally another layer, referred to herein below as a cap layer CAPL may be grown on the passivation layer PL in crystalline form in order to pin the Fermi-level $E_F$ within the large band gap of the passivation layer PL to prevent surface current conduction.

To this end, according to some embodiments the passivation layer PL is configured such that the equilibrium Fermi level (EFL) passes through its band gap, preferably such that its valence and conduction bands are each at least 10 $k_B T_{op}$ away from the EFL (where $k_B$ is the Boltzmann constant and $T_{op}$ is the operational temperature of the photodetector), so that they do not contain enough carriers to conduct between the electric contact regions (contact pads/bumps) of different pixels (e.g. deposited as metal pads through vias etched through the in-situ passivation structure ISPS), and the cap layer CAPL with its high density of surface states ensures that the equilibrium Fermi level at the surface is well within this band-gap. It should be noted that passivation layer PL and possibly also the Cap layer CAPL may be grown in situ within the crystal growth machine/chamber in which the semiconductor structure (the device layers) is grown.

As indicated above the use of the in-situ passivation structure is specifically advantageous for passivation of p-type semiconductor layers, particularly a p-type T2SL. Examples of the configuration and growth technique of such in-situ passivation structures which can be used in the framework of the present invention are described in detail in IL Patent Application No. 238,368 which is assigned to the assignee of the present application and incorporated herein by reference. Then, after, growing the in-situ passivation structure, in 270.1, operation 260.2 may be carried out to fabricate the contact layer CL as spaced apart metallic contacts located on top the second barrier layer BL2. Operation 260.2 is particularly suited when the second barrier layer BL2 is p-type doped since then the diode junction DJ2 is formed at the interface between the metallic contacts and the second barrier layer (formed as a Schottky diode). Operation 260.2 is performed ex-situ (outside, after removing the semiconductor structure ST from the crystal growth machine), and includes: etching one or more vias through the in-situ passivation structure ISPS down to the second barrier layer BL2 of the semiconductor structure ST (where in this case the in-situ passivation structure has been grown directly on top of the barrier layer and the contact layer CL is still absent) to expose one or more spaced apart regions of the surface of the second barrier layer BL2, and then depositing/fabricating one or more metal contacts through the vias onto the exposed regions of the barrier layer BL2. In this case the contact layer CL includes metal materials and is configured to design contact region(s) at which the metal materials are interfaced with the barrier layer BL2, thereby forming the diode junction DJ2 as a Schottky junction. According to some embodiments the photodetector includes a plurality of pixels and each of the contacts defines, and/or is associated with, a different pixel of the device.

Figure 5A:
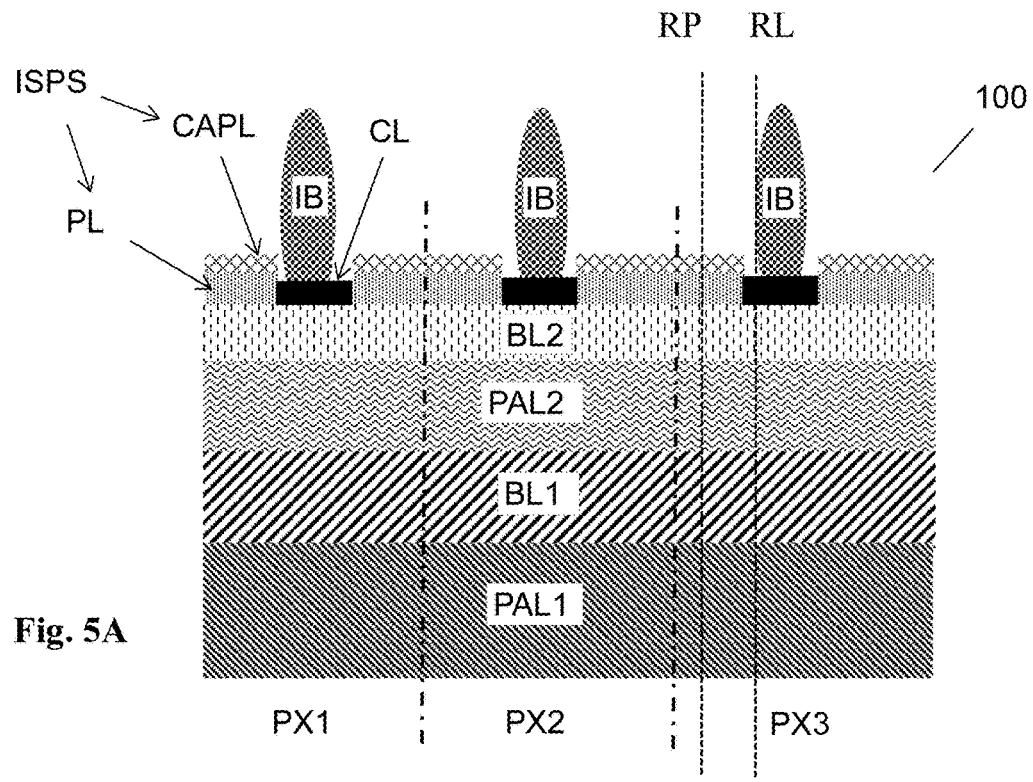
FIG. 5A illustrates a semiconductor layer structure of a dual band photodetector 100 according to embodiments of the present invention, which includes an in-situ passivation structure.

FIG. 5A illustrates the semiconductor layer structure ST of a dual band photodetector 100 according to embodiments of the present invention which include an in-situ passivation structure ISPS comprising an in-situ grown passivation layer PL and in-situ grown cap layer CAPL. In this case the contact layer CL in certain regions of the semiconductor layer structure ST has been replaced by an in-situ passivation structure ISPS.

The reference cross section line RL in the figure passes across semiconductor layer structure ST and through the contact layer. The energy band configuration of the semiconductor layer structure ST along this line RL may be for example similar to that illustrated in FIGS. 3A and 3B, in case the first and second UPMs are respectively doped n-type and p-type. In case the first and second UPMs are doped p-type and n-type, the energy band configuration of the semiconductor layer structure ST along this line RL may be for example similar to that illustrated in FIG. 3D.

Figure 5B:
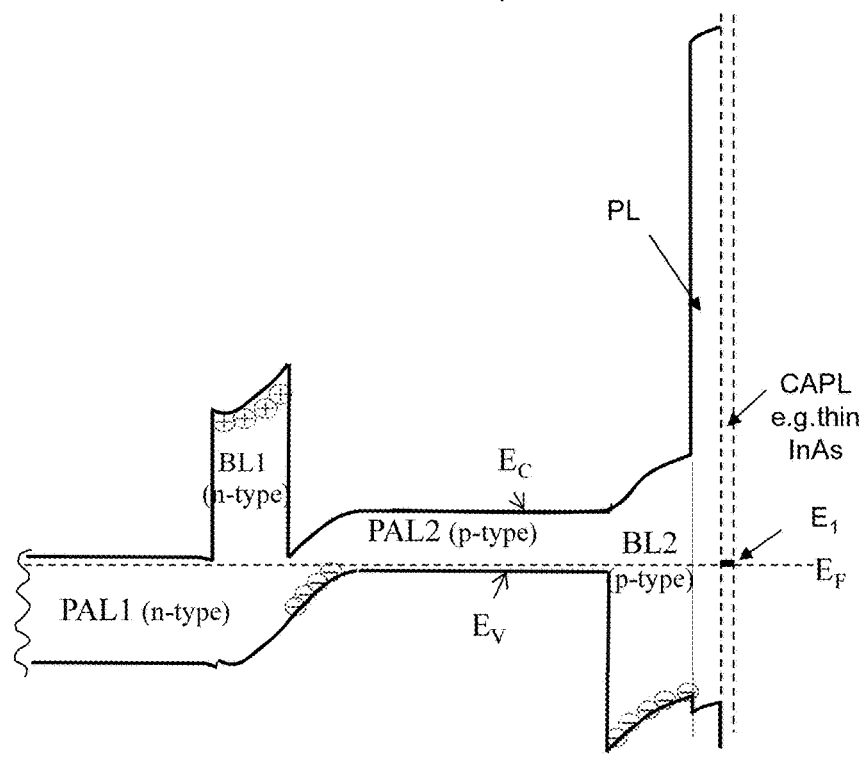
FIGS. 5B and 5C show in a self-explanatory manner the energy band configuration of the semiconductor layer structure shown in FIG. 5A.
Figure 5C:
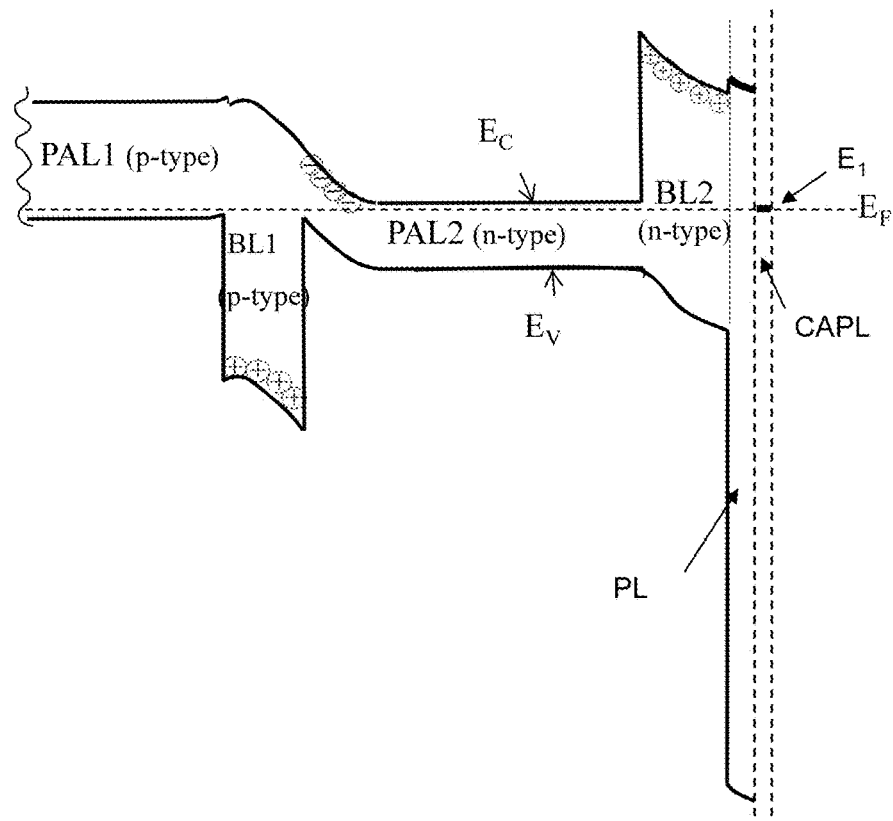

FIGS. 5B and 5C show in a self-explanatory manner the energy band configuration of the semiconductor layer structure ST along the reference cross section line RP in FIG. 5A which passes across semiconductor layer structure ST where the contact layer CL (in FIG. 2) has been replaced by an in-situ passivation structure ISPS including the passivation layer PL and cap layer CAPL. FIG. 5B pertains to the case when the first and second UPMs are respectively doped n-type and p-type, and FIG. 5C pertains to the case of the opposite doping polarity where the first and second UPMs are respectively doped p-type and n-type. In both cases passivation layer PL is configured with a wide band-gap such that the equilibrium Fermi level $E_F$ passes through its band gap far away from its conduction and valence bands (preferably such that its valence and conduction bands are each at least $10\,k_B T_{op}$ away from the equilibrium Fermi level $E_F$). As described in IL Patent Application No. 238,368, the in situ passivation layer PL can be implemented with properly selected lattice matched III-V material. To this end according to the present invention, the second UPM UPM2 in situ passivation layer PL can be implemented with properly selected lattice matched III-V material including a material such as AlSbAs for the passivation layer PL, which can be grown on a p-type InAs/AlSb type II superlattice for the second barrier layer BL2, and a p-type InAs/GaSb type II superlattice for the second photon absorbing layer PAL2. For the first UPM UPM1 lattice matched III-V materials can be used such as n-type GaAlSbAs for the first barrier layer BL1 and n-type InAs/GaSb type II superlattice for the first photon absorbing layer PAL1. All of the listed materials can be grown with reasonable lattice matching using a GaSb substrate. The n-type InAs/GaSb type II superlattice used for the first photon absorbing layer PAL1 should be designed with InAs and GaSb layers that are thin enough to yield a mini-band width for the minority carriers (holes) of several times $k_B T_{op}$ so that their effective mass will be small enough to ensure a diffusion length larger than the thickness of the first photon absorbing layer PAL1. The thicknesses of the first (PAL1) and second (PAL2) photon absorbing layers should be such that they absorb most of the radiation in the λ1 and λ2 wavelength ranges respectively. A reflecting layer can be used on the top surface (i.e. on top of the in-situ passivation structure ISPS in FIG. 5A) so that together with the contact layer CL it reflects any unabsorbed λ2 radiation back for a second pass through the second photon absorbing layer PAL2. Further details are presented below. The Cap layer CAPL is a material selected to have a very high density of surface states at a suitable energy that lies well within the band gap of the second barrier layer BL2. To this end, the Fermi energy at the surface of the cap layer CAPL is pinned very close to the energy $E_1$ indicated in FIG. 5B. Thus the equilibrium Fermi level along the line RP passes from the Fermi level of the p-type second photon absorbing layer PAL2 through the depleted second barrier layer BL2 and the depleted passivation layer PL (which is doped p-type) of the in-situ passivation structure ISPS and ends near the energy level $E_1$ where it is pinned by the high density of surface states.

Turning back to the method 200 illustrated in FIG. 4, optionally according to some embodiments of the present invention operation 260 and optional operation 270 are carried out by first performing operation 260.1 for implementing/fabricating the contact layer CL, and the optional performance of operation 270.2 in which ex-situ passivation ESP is applied for passivating exposed surfaces of the photodetector 100.

More specifically operation 260.1, includes fabricating the contact layer CL by in-situ crystal growth of a semiconductor contact layer CL on top of the second barrier layer BL2, wherein the crystallized contact layer has in this case the doping polarity DP1 opposite to that of the second barrier layer BL2 so that an n-p diode junction DJ2 is defined between them (as indicated above the region of the doping polarity DP1 may also extend into the second barrier layer BL2 so that the diode junction DJ2 is actually formed within the second barrier layer BL2). After in-situ growth of the contact layer CL, the semiconductor structure ST may be taken out of the crystal growth machine/chamber, and operation 260.1 may include etching of the contact layer CL to form mesa structures defining one or more spaced apart contact regions associated with one or more respective pixels of the photodetector 100. Then operation 270.2 may be carried out to passivate the exposed surfaces of the semiconductor structure ST by utilizing ex-situ passivation techniques (e.g. by applying passivation materials such as dielectric materials onto the exposed surfaces). This is performed after the layer structure ST is grown and taken out of the crystal growth machine/chamber, and may be carried out according to any suitable technique for ex-situ passivation, such as those readily known in the art (e.g. by spinning, or evaporation or gas phase deposition, or plasma enhanced chemical vapor deposition). A photodetector device 100 configured according to the present invention by carrying out operations 260.1 and 270.2 is schematically illustrated for example in self-explanatory manner in FIG. 5D.

As indicated above, in some cases ex-situ passivation ESP is particularly suited for passivating semiconductor layers which are doped n-type. To this end, in some embodiments of the present invention in which the second barrier layer BL2 is doped n-type (DP2 is n-type), ex-situ passivation (e.g. according to operation 270.2) may be applied. In some embodiments of the present invention in which the second barrier layer BL2 is doped p-type (DP2 is p-type), in-situ passivation (e.g. according to operation 270.1) may be applied (which is then followed by step 260.2 to create spaced apart metallic contacts CL in regions where the in-situ passivation is etched away, as depicted in FIG. 5A).

As indicated above, according to various embodiments of the present invention the photodetector 100 may be configured to define a single pixel (a single lateral light sensitive region) or a plurality of pixels, associated with a plurality of laterally arranged spaced apart light sensitive regions of the semiconductor structure ST. Each light sensitive region (pixel) is associated with a respective electric contact IB (e.g. made from one or more metals which are deposited in a certain order onto the contact layers CLs) by which a bias voltage $V_B$ can be applied to the pixel to select the wavelength range $\lambda 1$ or $\lambda 2$, which is to be sensed by the pixel and from which an electric signal indicative of the intensity of light in the selected wavelength range absorbed by the pixel can be obtained.

In some embodiments of the present invention the photodetector 100 includes a plurality of pixels. This is illustrated in self-explanatory manner for example in the embodiments of FIGS. 5A, 5D, 5E and 5H, each showing three pixels PX1, PX2 and PX3 included in the photodetector 100.

In FIG. 5A the photodetector 100 is shown with an in-situ passivation structure ISPS fabricated on the second barrier layer BL2. The contact layer CL in this case includes metal contact regions which are deposited (ex-situ) at places at which the in-situ passivation structure ISPS is etched away.

Figure 5D:
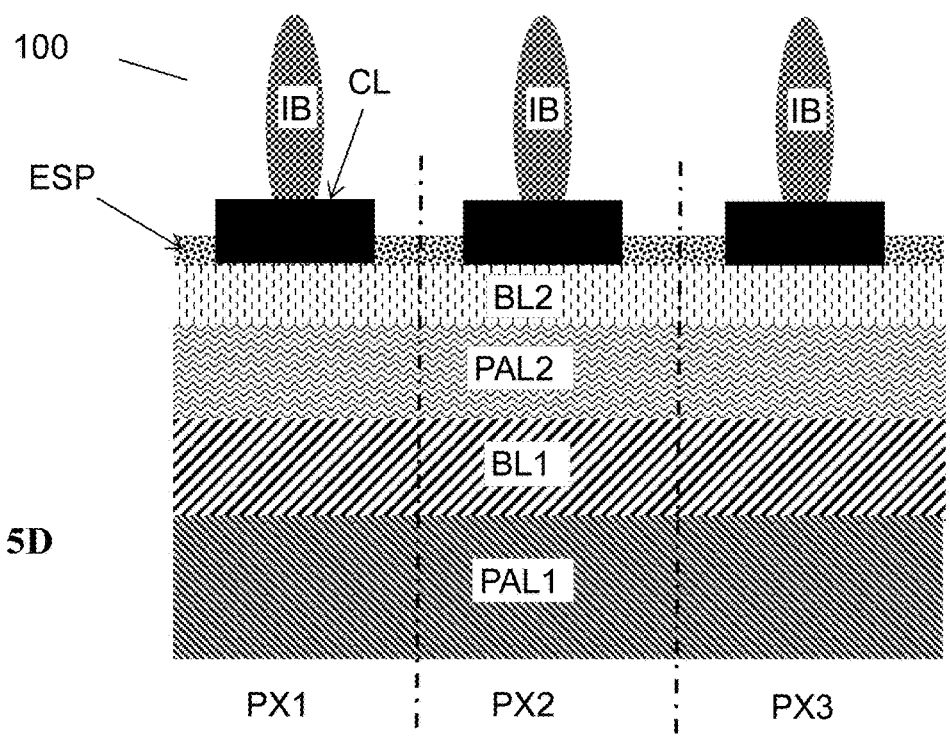
FIG. 5D shows a photodetector according to an embodiment of the present invention, which is passivated by ex-situ passivation.

In FIG. 5D the photodetector 100 is shown with an ex-situ passivation ESP fabricated on the second barrier layer BL2 (e.g. on exposed regions thereof). The contact layer CL in this case may include metal contacts deposited on spaced apart regions of the of the second barrier layer BL2 and surrounded by an ex-situ passivation ESP applied to the regions of the second barrier layer BL2 surrounding metal contacts, or alternatively or additionally the contact layer may include a semiconductor layer fabricated in-situ on the second barrier layer BL2, whereby parts of the semiconductor contact layer are etched away to define the contact regions while exposing the second barrier layer at regions surrounding them. Then ex-situ passivation ESP is fabricated on the exposed surfaces of the second barrier layer BL2 surrounding the contact regions.

When the electrical contacts of the detector pixels IB in FIGS. 5A and 5D are biased so that the first UPM UPM1 is in reverse bias (namely in order to detect wavelength range $\lambda 1$), the second photon absorbing layer PAL2 effectively serves as a contact layer for biasing the first UPM UPM1. Although in these examples of FIGS. 5A and 5D the second photon absorbing layer PAL2 extends across the whole set of pixels, electrical isolation between the pixels is still achieved by configuring the second photon absorbing layer PAL2 such that the valence energy band for its majority carriers is below a so called minimum metallic conductivity. In this way, a minority carrier (hole) generated by the absorption of a $\lambda 1$ photon in, for example, pixel PX2 diffuses to the first barrier layer BL1 where it drifts in the depletion field of the barrier BL1 into the second photon absorbing layer PAL2 where it is then a majority carrier. In order to ensure that it has a high probability of remaining in the same pixel PX2 the hole conductivity in the second photon absorbing layer PAL2 must be limited. This is explained in more detail below.

Figure 5E:
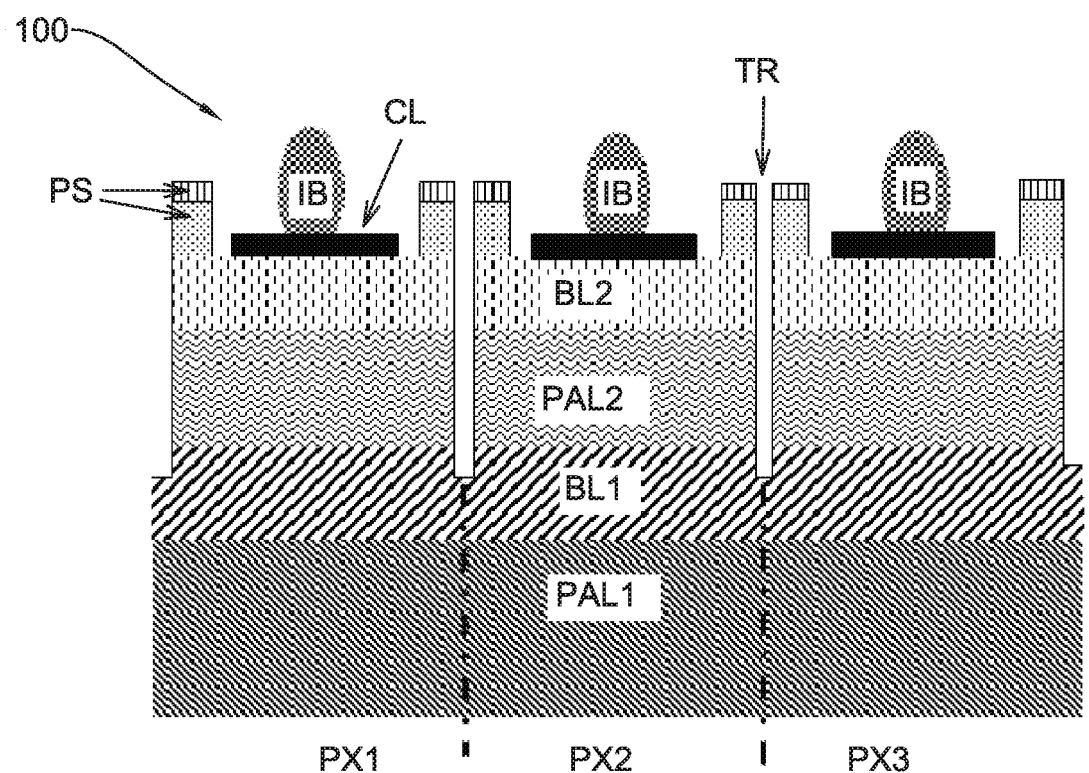
FIG. 5E illustrates a photodetector according to an embodiment of the present invention, in which electrical isolation between the pixels is achieved by etched trenches/mesas between the pixels.

FIG. 5E illustrates the photodetector 100 according to another embodiment of the present invention in which electrical isolation between the pixels is achieved by etching trenches/mesas in between the pixels to separate them. Here a general passivation layer/structure PS is shown, which may be an ex-situ passivation as the ESP in FIG. 5D or an in-situ passivation structure, as the ISPS shown in FIG. 5A.

When a photodetector 100 of the invention having multiple pixels is operated to detect the radiation in the second wavelength range $\lambda 2$ (i.e. operating in a second detection mode e.g. to detect $\lambda 2$ in the LWIR) absorbed in the second photon absorbing layer PAL2, the bias voltage $V_B$ is set such that the first diode junction DJ1 is in forward bias and the second diode junction DJ2 is in reverse bias. In this case, although the first UPM UPM1 becomes electrically connected with a low resistance to all the pixels in the photon absorbing layer PAL2 of the second UPM UPM2, it does not cause significant cross conduction between the pixels (or in other words it does not blur the individual pixel signals) since the first UPM UPM1 is actually coupled to the common electrical contact COM of the photodetector 100, and thus in this mode (detection of the second wavelength range $\lambda 2$) the first UPM UPM1 may be viewed/regarded as being itself a part of (serving as) the common contact COM (see FIG. 5H).

However, when a photodetector 100 of the invention having multiple pixels is operated to detect the radiation in the first wavelength range $\lambda 1$ (i.e. operation in a first detection mode e.g. to detect $\lambda 1$ in the MWIR), absorbed in the first photon absorbing layer PAL1, the bias voltage $V_B$ is set such that the first diode junction DJ1 is under reverse bias and the second DJ2 is under forward bias. Accordingly, the first UPM UPM1 is activated as a sensor (under reverse bias) while the second UPM UPM2 is effectively short circuited (under forward bias) i.e. its contact layer CL is connected with a low resistance to the photon absorbing layer PAL2. Since only this contact layer CL is divided into individual pixels (e.g. PX1, PX2 and PX3) then in the absence of trenches all the pixels become connected together through the low resistance forward biased junction DJ2 which could cause cross conduction between the pixels and blur the pixels' signals and deteriorate the ability to detect the individual pixel signals. Therefore in order to prevent/suppress this cross conduction between the pixels, in some embodiments of the present invention narrow vertical trenches are etched through the second photon absorbing layer PAL2 to a depth of at least the first barrier layer BL1.

More specifically, in this mode, detection of the first wavelength range $\lambda 1$, minority carriers $MC_U$ from the first photon absorbing layer PAL1 of the first UPM UPM1 flow across the first barrier layer BL1 of the first UPM UPM1 to reach the second photon absorbing layer PAL2 of the second UPM UPM2. Since the second diode junction DJ2 is under a forward bias, it injects minority carriers $MC_D$ into the second photon absorbing layer PAL2 (which have the opposite charge polarity to the minority carriers $MC_U$ from the first photon absorbing layer PAL1) in order to preserve current continuity in the whole structure and to maintain charge neutrality in the second photon absorbing layer PAL2. However, the excess of majority carriers of polarity $MC_U$ in the second photon absorbing layer PAL2 can normally flow freely between pixels since the majority carriers are distributed throughout the layer (i.e. delocalized) and flow by a "metallic" conduction mechanism, allowing cross conduction between the pixels as the excess electrical charge equilibrates on a very short time scale. This cross conduction between the pixels (cross conduction which might occur when the photodetector 100 is operated for detection of the first wavelength range λ1) is prevented by narrow vertical trenches which are etched down through at least the second photon absorbing layer PAL2, as illustrated for example in a self-explanatory manner in FIG. 5E.

FIG. 5E shows photodetector 100 with a plurality of pixels PX1, PX2 and PX3 and each pixel is defined by a mesa structure formed by etching trenches TR in between the pixels across the second photon absorbing layer PAL2 and down to the depletion region of the first diode junction DJ1 (e.g. which may be located within the first barrier layer BL1 up to the interface with the second photon absorbing layer PAL2 and the first barrier layer BL1). These mesas/trenches TR, are etched down to the first barrier layer BL1 (possibly also into the first barrier layer BL1 or even into the first photon absorbing layer PAL1) and electrically isolate the pixels from one another. To this end, according to some embodiments of the present invention method 200 includes optional operation 282 for etching trenches at regions surrounding the electric contact regions IBs of the pixels down to at least the first barrier layer BL1, to thereby define and electrically isolate pixels of the photodetector 100.

When trenches are etched to at least the depletion region of the first diode junction DJ1 located at or just below the surface of the first barrier layer BL1, an external passivation treatment ESP may be required on the exposed surfaces of the trenches, in particular exposed parts of the first barrier layer BL1, in order to prevent the accumulation of free charges on this surface which could cause current leakage and hence an increase in the dark current of the first UPM UPM1 and/or cross conduction between pixels. However, it is often the case, particularly when the barrier layer BL1 is made from an n-type III-V bulk alloy (or digital alloy) material with a large band gap, that this procedure is unnecessary although it is preferable to protect the exposed surface of the trenches against oxidation by depositing a suitable protection material [5].

Alternatively or additionally, according to some embodiments of the present invention the pixels can be sufficiently electrically isolated from one another by configuring the second photon absorbing layer PAL2 such that it has a reduced electrical conductivity for its majority carriers. In some embodiments of the present invention this is for example achieved by carrying out optional operation 242 of method 200 during the fabrication of (growth of) the second photon absorbing layer PAL2 (operation 240) for introducing disorder into the second photon absorbing layer PAL2. Accordingly in some embodiments of the present invention a need to etch mesas/trenches to separate between the pixels of the photodetector 100 may be obviated (e.g. see for example FIGS. 5A and 5D showing the plurality of pixels with no trenches between them). Instead, electrical isolation between the pixels (when operating in the first detection mode) is achieved by configuring the second photon absorbing layer PAL2 of the second UPM UPM2 such that a level of disorder in the periodicity of the photon absorbing layer PAL2 (of the crystal lattice structure thereof) is sufficiently high such that the band for the majority carriers (e.g. valence band) in the second photon absorbing layer PAL2 exhibits a conductivity below the so called minimum metallic conductivity (the material is said to have undergone a "metal to insulator transition"). In this configuration the disruption of the crystalline periodicity (by variations in the superlattice period and/or by the introduction of a disordered distribution of ionized donors and/or acceptors) leads to localization of the majority carriers (holes) in the second photon absorbing layer PAL2 so that they can only diffuse by hopping between localized sites (as opposed to conduction in an ordered crystal lattice where the majority carriers are delocalized). This provides for suppressing cross conduction between pixels, of electrical signals originating from the absorption of light by the first UPM UPM1, when the device is operated in the first detection mode.

More specifically, when the level of disorder in the second photon absorbing layer PAL2 is high enough to cause the majority carriers (holes) to be below a minimum metallic conductivity, these majority carriers are then localized and can only conduct at a finite absolute temperature by a mechanism generally known as a hopping mechanism. In this case, cross conduction between the pixels is strongly suppressed. Yet, due to a sufficiently large diffusion length of the minority carriers (electrons) in the second photon absorbing layer PAL2, sufficient conductivity may be maintained between the second UPM UPM2 and the respective electric contact regions IBs of the pixels. This is because when the second photon absorbing layer PAL2 is configured such that the diffusion length of the minority carriers is sufficiently large (typically several microns and preferably larger than the thickness of the second photon absorbing layer PAL2) it allows the minority carriers, which are attracted to the localized (and oppositely charged) majority carriers, to move/diffuse towards the localized majority carriers and recombine with them, thereby establishing and maintaining continuity of the electrical current across the second UPM UPM2 between the first UPM UPM1 and the pixels' respective electrical contacts IBs.

Figure 5F:
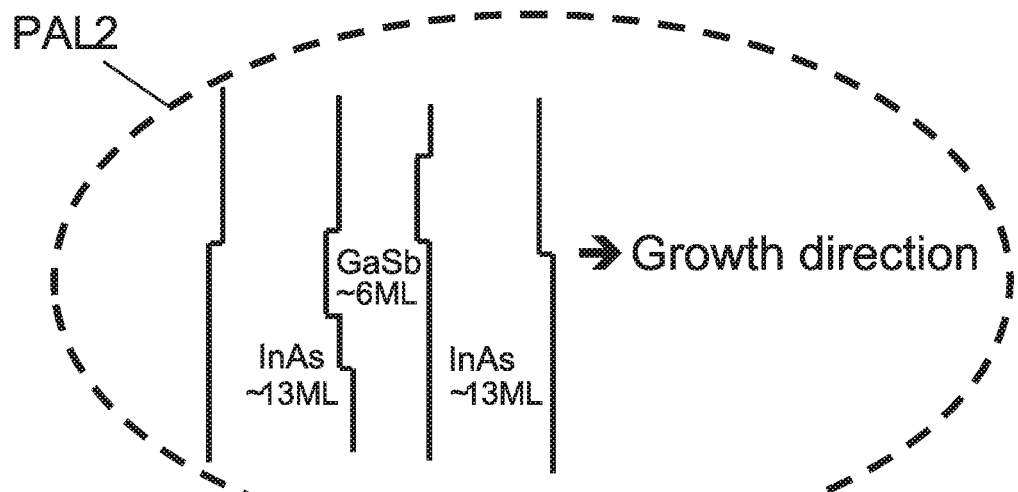
FIG. 5F exemplifies, in a self-explanatory manner, the configuration of a second photon absorbing layer PAL2 of a photodetector according to an embodiment of the present invention, which includes a superlattice structure/layer with a certain level of disorder in the width (number of monolayers) of its sub layers, providing for localization of the majority carriers therein.

Thus, as indicated above optionally, by carrying out optional operation 242, disorder is introduced into the second photon absorbing layer PAL2, for example when fabricating the second photon absorbing layer PAL2 as an InAs/GaSb T2SL. The second photon absorbing layer PAL2 fabricated in this way is illustrated in a self-explanatory manner in FIG. 5F, which includes sub-layers of InAs of typically about 13 monolayers separated by GaSb sub-layers of typically about 6 monolayers. In this example of FIG. 5F, disorder (lateral and in the growth direction) is shown in the width (number of monolayers) of the InAs and GaSb sub-layers of the superlattice structure of the photon absorbing layer PAL2 thus introducing disorder into the second photon absorbing layer PAL2. It should be noted that when fabricating the second photon absorbing layer PAL2 in this way, disorder may be introduced into the width (number of monolayers) of the GaSb sub-layers by naturally occurring random monolayer steps at the InAs/GaSb interfaces. Such disorder can cause the majority carriers (holes in the case that PAL2 is p-type) to become trapped in the widest parts of GaSb sub layers where the local hole confinement energy is smallest, thus enhancing localization of the majority carriers. Growing the second photon absorbing layer PAL2 in this way (with disorder) exploits natural variations of the width of the GaSb layers in the T2SL. The holes (majority carriers) are strongly confined in these layers because their effective mass is large so they exhibit poor penetration into the neighboring InAs layers. If the T2SL is designed so that the overlap of the hole wave functions between adjacent GaSb layers is small enough, natural fluctuations of the GaSb widths by plus or minus one or more monolayers will lead to carrier localization. Such localization due to disorder is described for example in the book by N. F. Mott entitled "*Metal-Insulator transitions*" $2^{nd}$ Edition, Taylor and Francis: London 1990 (Ref. [6]). On the other hand, the overlap of the wave functions of the electrons (minority carriers) from the lowest quantum confined energy levels in each InAs layer is much larger, because the electrons have a much lower effective mass (more than 10 times lower). The electrons will therefore remain delocalized, with a larger diffusion length than the holes (which diffuse by hopping between localized levels).

In some implementations of the invention, in case this level of disorder achieved by the variable widths of the GaSb sub-layers is not sufficient to maintain the hole transport in the second photon absorbing layer PAL2 below a minimum metallic conductivity, the level of disorder may also be increased by intentional variations of the widths of each period of the T2SL, or by doping the second photon absorbing layer PAL2 with silicon (Si), ideally by doping at the InAs/GaSb interfaces (sometimes known as delta-doping). Silicon atoms serve as a donor in the InAs sub-layers of PAL2, and as an acceptor in the GaSb sub-layers of PAL2 so depending on which side of the interface the silicon atoms reside they either become positively charged (ionized donor) or negatively charged (ionized acceptor), thereby introducing a randomly ionized space charge distribution into the second photon absorbing layer PAL2, which enhances the localization energy of the majority carriers (holes) therein and thereby enables the second photon absorbing layer PAL2 to be below a minimum metallic conductivity. This method of enhancing carrier localization in InAs/GaSb structures can be tuned by varying the amount of silicon that is introduced, as described for example in the article by Du. et al. (Ref [7]).

It is noted that according to some embodiments of the method 200 of the invention, operations 220 to 250 and optionally operations 260 (i.e. 260.1) and/or 270 (i.e. 270.1) may all be performed in-situ within the crystal growth chamber, possibly without taking the semiconductor structure ST out of the crystal growth chamber. This includes fabrication/growth of the crystallized semiconductor layers PAL1, BL1, PAL2, BL2, (operations 220 to 250) and optionally also growing of the contact layer CL (operation 260.1) in case it is from semiconductor material, and/or optionally growing the layers of in-situ passivation structure (operation 270.1 which is carried out in embodiments where the in-situ passivation technique is used, as opposed to conventional ex-situ passivation), which are performed in-situ within the semiconductor crystal growth machine/chamber.

Figure 5G:
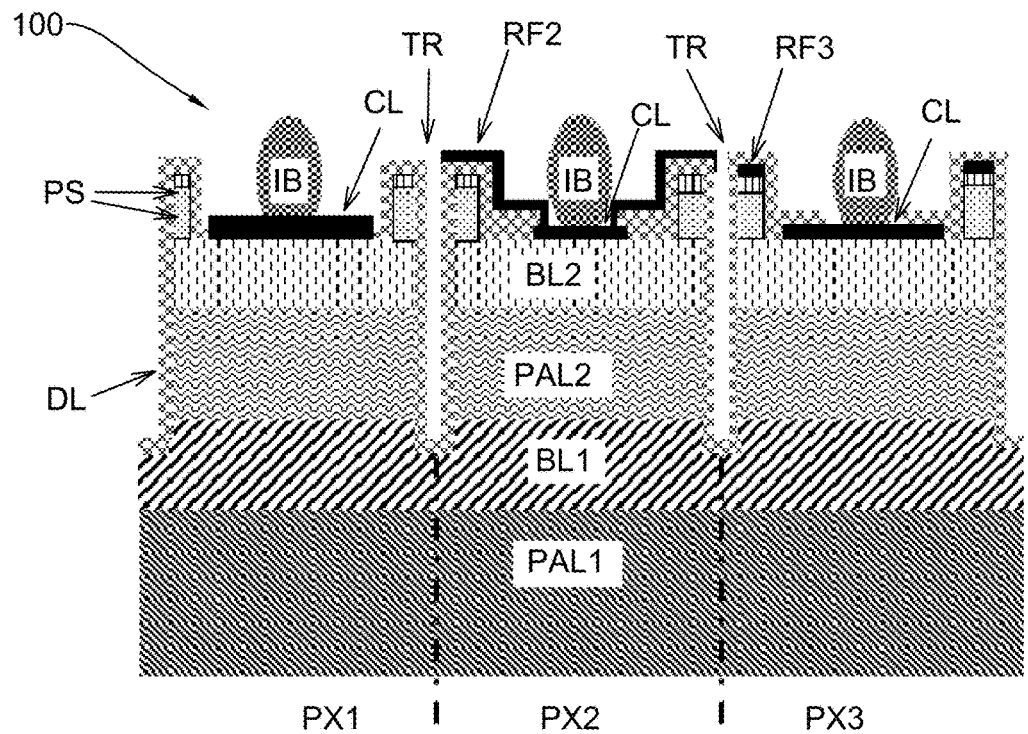
FIGS. 5G and 5H are schematic illustrations of a photodetector according to certain embodiments of the present invention, in which a reflective layer is applied on top of the passivation and where in one case (FIG. 5H) the photodetector is shown bonded to a read out circuit with a glue under-fill.

According to some embodiments of the present invention as also illustrated in the photodetector pixels exemplified in FIG. 5G, a reflective layer RF2 or RF3 (e.g. metal layer) is applied/deposited on top of the passivation PS (which may be an in-situ passivation structure), possibly/optionally with or without a transparent dielectric layer/material DL between them (the optional transparent dielectric material DL is shown in FIG. 5G). In FIG. 5G three different pixel designs are shown, PX1 which contains no reflective layer and is the same as the pixel in FIG. 5E, and PX2 and PX3 which contain a reflective layer, RF2 and RF3, respectively. It should be understood according to various embodiments of the photodetector of the present invention, that all the pixels may be configured according to any one of the pixel designs PX1, PX2 and PX3 illustrated in this figure or a combination thereof. The reflective layer RF2 or RF3 as well as optionally the reflective properties of the electric contacts (contact pads to which the indium bumps IB of the pixels are connected, or the contact layer CL itself if made from a suitable metal), may reflect light back for a second pass across the semiconductor structure ST and thereby optionally increase the quantum efficiency of the light detection of the device, particularly the quantum efficiency of detection of the second wavelength range λ2 by the second UPM UPM2. In pixel PX2 of FIG. 5G, a metal contact layer CL is shown which is reflective and which is connected to a reflective layer RF2 that covers most of the pixel area and which is isolated from the passivation structure PS (which in this case is preferably an in-situ passivation structure ISPS) by the thin transparent dielectric layer DL. In pixel PX3 of the same Figure, a reflective metal contact layer CL is shown which covers most of the area of the via passing through the passivation structure PS (which in this case is preferably an in-situ passivation structure ISPS) but which does not touch the passivation structure PS. The reflective layer RF3 is deposited on the top of the passivation structure PS and extends close to the edge of the pixel but is electrically separated from the sidewall of the passivation structure exposed by the via passing through it on one side and the trench TR on the other side. Although three different pixel designs are shown in FIG. 5G, only one single design should be used for every pixel in a given detector, both for ease of manufacturing and to ensure good image uniformity. It should also be clear that in detector designs such as that shown in FIG. 5A which do not include trenches, the trenches shown in FIG. 5G may be omitted, so that the passivation structure PS and uppermost part of the dielectric layer DL are continuous between pixels (as are the layers of material beneath the passivation structure PS), and so that there are small gaps between the reflective layers RF2 of individual pixels (reflective layers RF3 may be continuous across pixels because they are not connected to the contact layers, CL).

It should be noted that the semiconductor structure ST of the photodetector 100 in this example may be configured according to any one of the embodiments described above, and may include a single pixel or a plurality of pixels. Passivation of the photodetector may be achieved by utilizing ex-situ passivation (as described with reference to FIG. 5D) and/or an in-situ passivation structure (as described with reference to FIGS. 5A-5C), and electric isolation between the pixels may be achieved by etched trenches TR (mesa structure as exemplified in the figures and described above with reference to FIG. 5E or 5G) or by introducing disorder in the second photon absorbing layer (as described with reference to FIG. 5F, and FIGS. 5A and 5D).

Figure 5H:
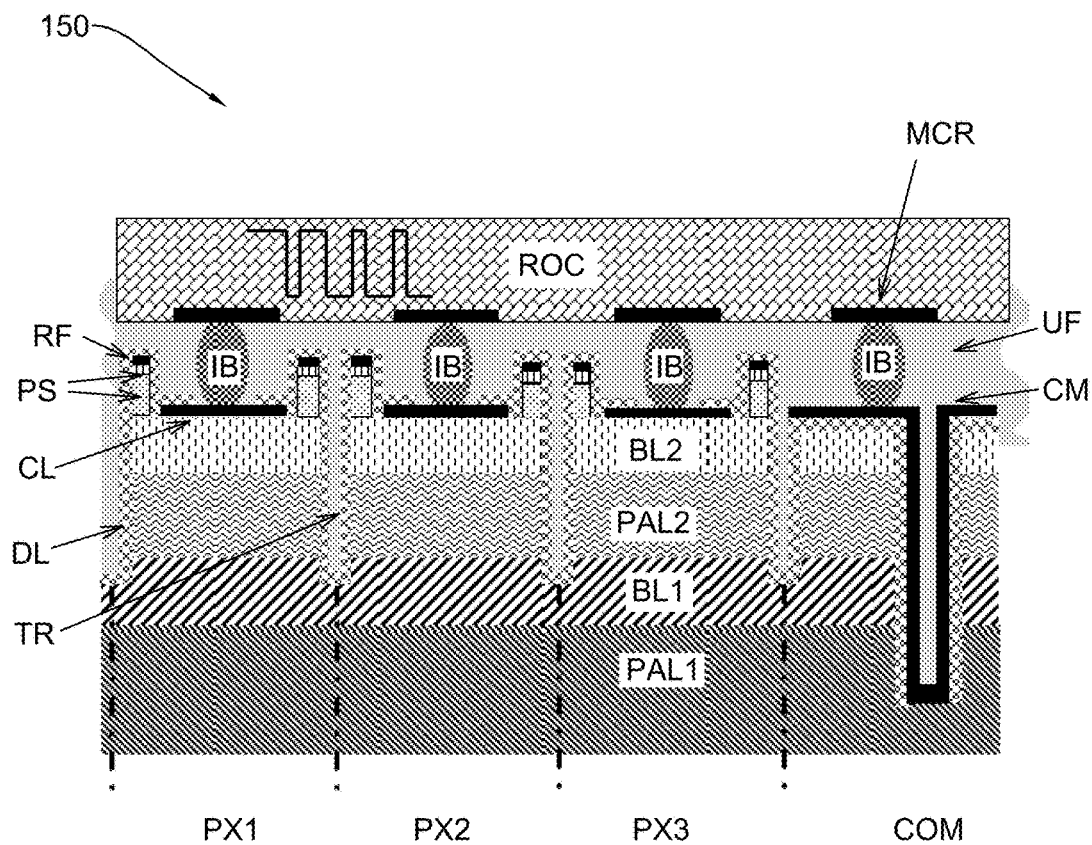

Reference is now made to FIG. 5H showing a photodetector 150 according to another embodiment of the present invention. In this example a pixel design similar to that shown in PX3 of FIG. 5G is used in which a reflective layer RF is like reflective layer RF3 in FIG. 5G (and the passivation structure PS is preferably an in-situ passivation structure ISPS). Moreover, a common contact COM is illustrated in FIG. 5H showing an indium bump IB connected to a metal contact CM which extends through a via passing/etched through the semiconductor structure ST of the photodetector 150 down to at least one of the first photon absorbing layer PAL1 of the first UPM UPM1 or further down to a conducting buffer layer or substrate layer on which the first photon absorbing layer PAL1 was grown. The common contact metal is preferably isolated from the layers of the device structure ST by an insulating dielectric layer DL except near the bottom of the etched via where it is directly in contact with the photon absorbing layer PAL1 of the first UPM UPM1 (as shown in FIG. 5H) or alternatively, a conducting buffer or substrate layer. The common contact COM serves for applying the bias voltage to all the pixels of the device and to receive the photocurrent therefrom, where the bias voltage and photocurrent of each pixel is applied/obtained between the common contact CM (and its indium bump IB) and the electric contact IB (indium bump) of the specific pixel. To this end the electric contacts, namely IB (e.g. indium bumps) of the individual pixels and the common contact COM may be connected to the contact pads MCR of a readout circuit ROC (e.g. a silicon read out integrated circuit (ROIC)) and the space between may be filled with a glue under-fill UF.

For this purpose the ROC may include a voltage source connectable in between at least one pixel contact and the common contact and selectively operable for applying positive and negative bias voltages in between the pixel and common contacts, and electric circuitry adapted to obtain and measure an electrical signal (photocurrent) to thereby obtain data indicative of detection of radiation in the first and/or second wavelength ranges (depending on the electric polarity of the bias voltage applied to the pixel).

According to some embodiments most/all of the substrate and possibly also including any buffer layer(s) on to which the first photon absorbing layer PAL1 was grown may be polished away to reduce strain/stress which may be caused by differences in the coefficients of thermal expansion (CTE) between the III-V materials in the semiconductor structure and the silicon material of the ROC upon cooling the device to low temperatures during operation.

Figure 6:
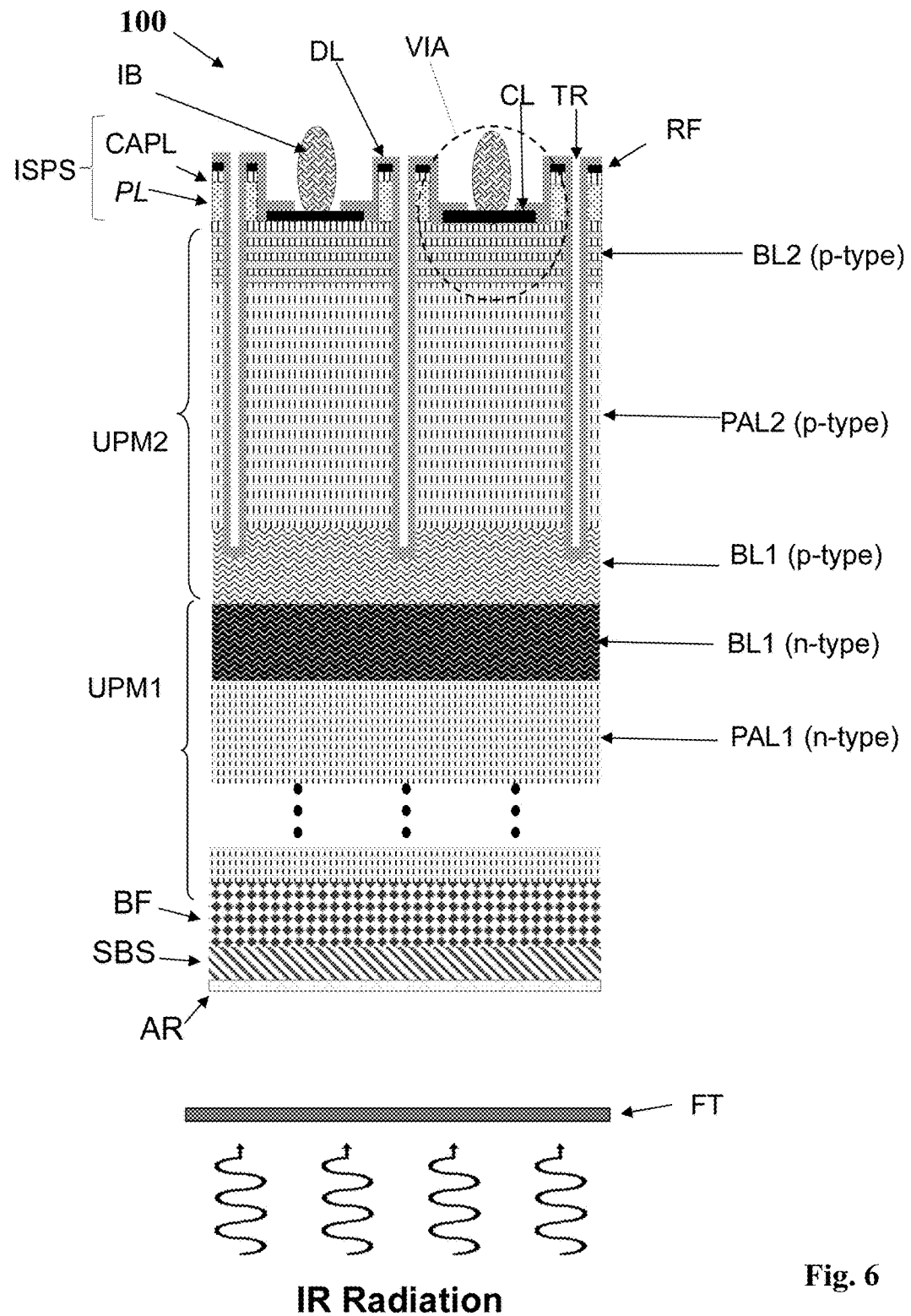
FIG. 6 is a schematic illustration of a dual band photodetector 100 configured according to an embodiment of the present invention, in which the photon absorbing layers include different type II superlattice semiconductor structures (T2SL)

FIG. 6 is a schematic illustration of a dual band photodetector 100 configured according to an embodiment of the present invention where the semiconductor structure ST includes different type II superlattice semiconductor materials (T2SL) and a bulk alloy material that are arranged/stacked one upon the other to define two UPMs, UPM1 and UPM2 of opposite doping polarities defining a first diode junction between them DJ1 and metal contacts on top of the second UPM UPM2 forming a second diode junction DJ2. Use of superlattices, and particularly Type II superlattices is advantageous in various applications implementations of the present invention since it provides a practical way for adjusting the energy bands and the band-gaps of the photon absorbing layer(s), the barrier-layer(s) and/or the in-situ passivation layer(s), such that the photodetector can be configured for sensing the desired wavelengths ranges, while with low/diffusion limited dark currents. The designs of the superlattices may be based for example on calculations described in Ref. [4].

However, as will be readily appreciated by those versed in the art, in superlattices in general, and in particular in Type II superlattices such as InAs/GaSb or superlattice layers made from different compositions of InAsSb such as InAs/InAsSb, the mobility of electrons is much larger than the mobility of holes. In the photon absorbing layers (e.g. PAL1 and PAL2), it is essential that the mobility (diffusion length) of the minority carriers therein will be sufficient (e.g. of order of the thickness of the photon absorbing layer) so that minority carriers created in response to absorption of photons therein can diffuse across the thickness of the photon absorbing layer and into the barrier layer without recombining and thereby conduct the photocurrent without losses. This is in general less of a problem in cases where the photon absorbing layer is a T2SL doped p-type, because in this case the minority carriers are electrons, in which mobility in the T2SL is typically sufficient. However, when using a photon absorbing layer that is an n-type doped T2SL, care should be taken in designing the T2SL structure of the layer so that sufficient hole mobility is obtained.

Indeed, in some cases fabrication of n-type doped T2SL photon absorbing layers with an energy band gap, suited for absorbing photons in the LWIR, may be not practical. This is because the InAs and GaSb layers are too thick to allow any significant dispersion of the hole mini-band formed by the overlap of the hole wave functions (i.e. its effective mass is not small enough) (see Ref. [4]). However, the inventor of the present invention found that fabricating of n-type doped T2SL photon absorbing layers with an energy band-gap, that is suited for absorbing photons in the MWIR wavelength range and that has sufficient hole (minority carrier) mobility, is possible and practical.

To this end, an embodiment of the photodetector 100 of the present invention configured and operable for detection of MWIR and LWIR wavelength ranges is illustrated in FIG. 6. The photodetector 100 is generally configured as described above with reference to FIGS. 2, 3B and 5H and includes type II superlattice semiconductor materials (T2SL) for the photon absorbing layers PAL1 and PAL2 in each of two UPMs, UPM1 and UPM2, of opposite doping polarities, whereby the first UPM UPM1 is doped n-type and its photon absorbing layer PAL1 is configured for absorbing photons in the MWIR and the second UPM UPM2 is doped p-type and its photon absorbing layer PAL2 is configured for absorbing photons in the LWIR.

Figure 7A:
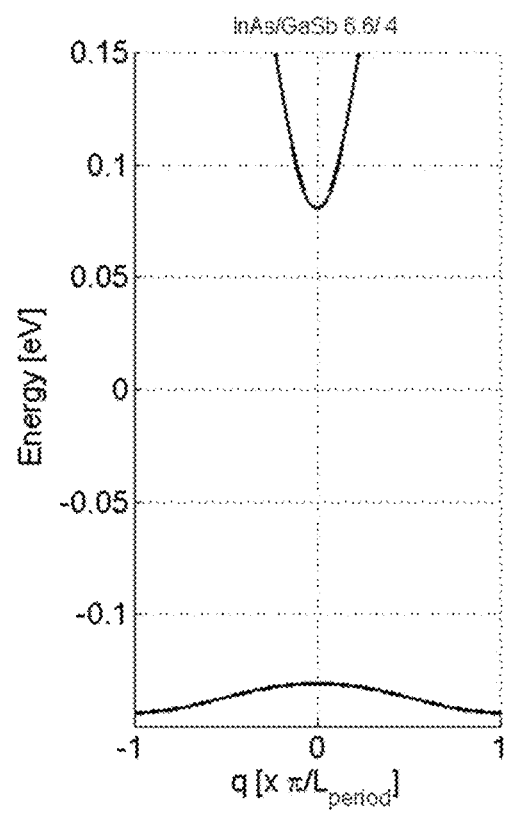
FIGS. 7A and 7B are self-explanatory graphs showing the dispersions of the conduction and valence mini-bands (FIG.
Figure 7B:
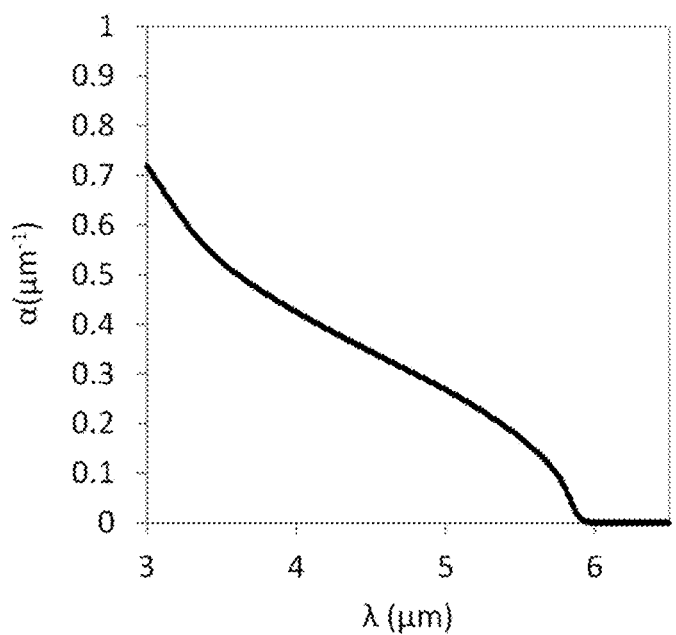

In this example the first photon absorbing layer PAL1 may be configured as a type II, InAs/GaSb, n-type superlattice the period of which is approximately 6.6 monolayers of InAs and 4 monolayers of GaSb (including the interfaces which are "In—Sb" like). The energy band gap in the photon absorbing layer PAL1 is then suitable for absorbing photons in the MWIR. Note that a non-integer number of monolayers can be considered to describe layers whose interfaces are not perfectly flat but include monolayer steps, such that their average thicknesses correspond to non-integer values (see for example FIG. 5F). This configuration of the n-type superlattice with 6.6 monolayers of InAs and 4 monolayers has an estimated band gap wavelength of 5.9 μm suitable for sensing MWIR radiation, while on the other hand results in sufficient mobility of the minority charge carriers (holes) in the n-type photon absorbing layer PAL1. Dispersions of the conduction and valence mini-bands along the growth direction of the photon absorbing layer PAL1 are shown in FIG. 7A, calculated using the k·p method described above [4]. The valence band (the band containing the holes) has a width for zero in-plane wave vector of about 14 meV which is close to $2k_BT_{op}$ at 77K. It corresponds to an effective mass in the growth direction of about 0.25 times the free electron mass and the width of the mini-band increases substantially (i.e. the effective mass decreases substantially) for small values of in-plane wave vector. Therefore the holes are expected to be fairly mobile. FIG. 7B shows the absorption spectrum of the photon absorbing layer PAL1, calculated using the same method. As shown, the photon absorbing layer PAL1 demonstrates a large absorption coefficient and a cut-off wavelength of 5.9 μm. In this implementation, the cut-off is designed intentionally to be larger than the long wavelength boundary of the MWIR atmospheric transmission window (~5 μm) so that the MWIR wavelength range λ1 of UPM1 (typically 3-5 μm) can be defined by a filter FT passing wavelengths shorter than the desired cut-off wavelength (e.g. 5 μm to match the atmospheric window). The use of a filter FT ensures that all of the wavelength range λ1 is absorbed strongly by UPM1 and very few photons in this range continue to UPM2 where they would contribute to the optical crosstalk. Indeed, using the absorption spectrum in FIG. 7B and optical transfer matrix techniques (See Ref. [4]) it is estimated that more than 70% of the incident photons in the wavelength range λ1 are absorbed in the first UPM UPM1 when its thickness is 5 μm. Even if the remaining 30% are absorbed in the second UPM UPM2 this will normally only constitute an optical crosstalk of a few percent because the intensity of LWIR blackbody radiation (i.e. corresponding to the wavelength range $\lambda 2$) is nearly one order of magnitude higher than that of the MWIR blackbody radiation (i.e. corresponding to the wavelength range $\lambda 1$). Although the design of the T2SL period used for the first photon absorbing layer PAL1 is based on 6.6 monolayers of InAs and 4 monolayers of GaSb, it is not unique. For example, a T2SL with a period of 5.3 monolayers of InAs and 3.2 monolayers of GaSb is estimated to have a similar band gap wavelength of 5.9 μm and an even larger valence mini-band dispersion (smaller hole effective mass). However, as the InAs and GaSb layer thicknesses become thinner, growth control becomes more difficult and the number of shutter operations in the growth reactor (e.g. molecular beam epitaxy reactor) increases, reducing the time until they will need to be replaced. (i.e. too many shutter operations in the growth machine and/or too short a time between shutter operations to define the layer thicknesses with sufficient accuracy).

The second photon absorbing layer PAL2 may be configured as a type II InAs/GaSb, p-type superlattice with 13.5 monolayers of InAs and 7.2 monolayers of GaSb (including the interfaces which are "In—Sb" like). The energy band gap in the photon absorbing layer PAL2 is then suitable for absorbing photons in the LWIR with a cut-off wavelength of about 9.5 μm. This configuration of the p-type superlattice from one hand provides a band-gap suitable for sensing LWIR, while on the other hand results in sufficient mobility of the minority charge carriers (electrons) in the photon absorbing layer PAL2. The barrier layer BL2 may be configured as a type II InAs/AlSb, n-type superlattice with about 16.2 mono-layers of InAs and about 4.1 mono-layers of AlSb to provide a sufficiently high barrier band-gap with the energy of the conduction band $E_C$ relatively matching to the conduction band of the second photon absorbing layer PAL2. In all cases the InAs and GaSb (or AlSb) layers in the superlattices are designed so they are not too thin for fabrication in a growth chamber (e.g. a MBE growth chamber).

The first barrier layer BL1 may be configured as a III-V alloy material of AlGaSbAs (e.g. $Al_{0.28}Ga_{0.72}Sb_{0.975}As_{0.025}$; it might also be grown as a digital alloy with repeated units of very thin layers of different compositions so that the average composition of the digital alloy is the same as in a true alloy where all the atoms are mixed randomly together) to provide a sufficiently large barrier band gap with the energy of the valence band Ev relatively matching that of the valence band of the first photon absorbing layer PAL1. In this example the first barrier layer BL1 is configured as described above with reference to FIG. 3B whereby a part thereof adjacent to the first photon absorbing layer PAL1 is doped n-type (so that no depletion region is formed in the first photon absorbing layer PAL1) and the part of the barrier layer BL1 adjacent to the second photon absorbing layer PAL2 is doped p-type, so that the first diode junction DJ1 in between the first and second UPMs, actually exists within the barrier layer BL1 of the first UPM UPM1, at the interface between the n-doped and p-doped parts/regions thereof. The barrier layer thickness in this example is about 0.3-0.5 μm.

It should be noted that in some alternative implementations the first barrier layer BL1 in the photodetector 100 of FIG. 6 may also be configured as described above with reference to FIG. 3A whereby the entire barrier layer BL1 is doped n-type, and the first diode junction DJ1 between the first and second UPMs, is formed in between the first barrier layer BL1 and the second photon absorbing layer PAL2. The thickness of barrier layer BL1 in this case is about 0.1-0.5 μm. This structure is slightly easier to grow and characterize than that in FIG. 3B but may suffer from more noise when sensing wavelength range $\lambda 1$ due to possible fluctuations of free charges (electrons) generated by heat or the absorption of light in the second photon absorbing layer PAL2 and which collect near the first barrier layer BL1, until they recombine.

In this example the passivation of the photodetector includes an in-situ passivation structure ISPS configured as described above with reference to FIG. 5B and includes a passivation layer PL formed with (preferably p-type) AlSbAs semiconductor material (e.g. $AlSb_{0.91}As_{0.09}$ which is closely lattice matched to materials grown on a GaSb substrate) and a cap layer CAPL formed with a thin preferably n-type strained layer of InAs (or thicker unstrained layer of $InAs_{0.91}Sb_{0.09}$), where both layers are crystallized layers grown in-situ and lattice matched on top of the second barrier layer BL2. The contact layer CL includes metal contact pads deposited on the surface of the second barrier layer BL2 at the vias VIA which are formed/etched through the in-situ passivation structure ISPS. Here indium bumps/contacts IB are shown coupled to the metal contact pads of the contact layer, CL.

Considering a thin InAs cap layer CAPL (e.g. of thickness about 5-20 nm) used in this embodiment, it will exhibit quantum confinement causing the first electron state, $E_1$, in the cap-layer material to lie typically 30-300 meV above the conduction band energy of bulk InAs, $E_{C(InAs)}$. This state thus constitutes the edge of a two dimensional conduction band in the cap layer CAPL. As indicated in Ref. [8], InAs grows with a "high density of surface states which normally lead to a conducting skin, which is formed by an electron accumulation layer". To this end, the Fermi energy at the InAs surface of the cap layer CAPL is pinned just above the conduction band edge. In the present example it will be pinned very close to the energy $E_1$ indicated in FIG. 5B. Thus the equilibrium Fermi level along the line RP of FIG. 5A passes from the Fermi level of the p-type second photon absorbing layer PAL2 through the depleted second barrier layer BL2 and the depleted passivation layer PL (which is doped p-type) of the passivation structure ISPS and ends just above the energy level $E_1$ where it is pinned by the "high density of surface states" of the "conducting skin" of the cap layer CAPL of the passivation structure ISPS. For this purpose the cap layer CAPL should be in equilibrium with the second photon absorbing layer PAL2 (i.e. its Fermi level will align in a reasonable timescale (e.g. much less than the reciprocal of the frame rate of the detector) with the Fermi level in the second photon absorbing layer PAL2). This can occur naturally by a few crystal defects (which essentially always exist in such structures) which will cause a short circuit between the second photon absorbing layer PAL2 and the cap layer CAPL or (especially when trenches are etched between pixels) by ensuring that the second barrier layer BL2 and the passivation layer PL are not too thick, so that there is a small but finite probability of tunneling between the majority carriers of the second photon absorbing layer PAL2 and the surface states (near $E_1$). The second barrier layer BL2, however, should not be made so thin that the tunnel current of majority carriers from the second photon absorbing layer PAL2 to the contact layer CL is larger than the diffusion limited dark current of the second UPM UPM2 when operated with a reverse bias to detect wavelengths in the range $\lambda 2$.

A cap layer CAPL made from a thin or thick unstrained layer of $InAs_{0.91}Sb_{0.09}$ alloy (which contains predominantly InAs) will behave in a similar way to a cap layer CAPL made from InAs. The cap layer CAPL also serves to protect the passivation layer PL from oxidation. Since it is made from AlSbAs is will oxidize very quickly in the presence of atmospheric oxygen or moisture, if the cap layer is absent.

Also in this example trenches are etched to define mesa structures separating and electrically isolating the pixels, as described above with reference to FIG. 5H. It should be noted however that alternatively, in other implementations, disorder may be introduced into the second photon absorbing layer PAL2, (e.g. as described with reference to FIG. 5F), to set the photon absorbing layer below the minimum metallic conductivity, thereby isolating between the pixels as described with reference to FIG. 5A (and optionally obviating a need to etch the trenches). Calculations performed by the applicant based on the model in Ref. [4] show that a change of one monolayer in the thickness of the GaSb layer in the p-type type II InAs/GaSb superlattice with 13.5 monolayers of InAs and 7.2 monolayers of GaSb used above for the second photon absorbing layer PAL2 results in a shift of the valence band edge (i.e. the energy of the holes) by about 12 meV or 1.8 $k_B T_{op}$ at 77K. For a type II superlattice with 13 monolayers of InAs and 6.2 monolayers of GaSb which has the same band gap, the valence band shifts by 2.4 $k_B T_{op}$. These values are much larger than the valence mini-band width (<1 meV) at the zone center (no in-plane wave vector). On the other hand, the change to the energy of the conduction band edge is much smaller than the electron mini-band width. It is therefore possible to tune the random energy fluctuation of the holes due to natural monolayer variations of the layer widths in the LWIR type II superlattice until the conductivity of the majority carriers (holes) falls below the minimum metal conductivity value (i.e. the holes become localized and conduct by hopping between localized states), while at the same time ensuring that the electron conductivity remains "metallic" and involves only drift or diffusion of extended delocalized states. Delta-doping of the InAs/GaSb interfaces with silicon atoms can also be used to enhance/tune the random energy fluctuation of the holes and thus to further facilitate the localization of holes as already described above.

Additionally, in this example a dielectric layer DL is applied on top of semiconductor layer structure ST. This serves to protect the sidewalls of the pixel mesas exposed by the etching of the trenches down into at least the first barrier layer BL1 (e.g. against oxidation), and may also serve to reduce the surface recombination velocity of minority carriers on these sidewalls (thereby increasing the quantum efficiency of the detector).

As already mentioned above, in this embodiment a the photodetector may be configured and operable for use with a filter FT, which may be external or integrated with the photodetector and may be adapted for filtering wavelengths outside the desired MWIR and LWIR wavelength ranges λ1 and λ2. The filter defines the cut-off wavelength of the MWIR range (i.e. λ1) and the cut-on wavelength of the LWIR range (i.e. λ2) and reduces photon shot noise by removing any unwanted signals generated in the atmosphere or the relatively warm lens optics of the detector in the range between the λ1 cut-off wavelength and the λ2 cut-on wavelength. It also removes signals due to stray light. The desired wavelength ranges of the signals λ1 may for example be the wavelength range 3<λ1<5 µm and λ2 may be for example in the wavelength range 8<λ2<9.5 µm.

The operating temperature, $T_{op}$, of the detector 100 in FIG. 6 is normally defined by the UPM with the smallest band gap UPM2. For a typical LWIR wavelength range 8<λ2<9.5 µm, this temperature is may be close to 77K (see Ref. [4]), in order to ensure that the dark current of the detector is much lower than the photocurrent (typically more than 10 times lower). At this operating temperature, the dark current in the other UPM UPM1 is negligible and much lower than the photo-current due to photons in the λ1 wavelength range, because the band gap of the first UPM UPM1 is larger. For example, a MWIR UPM based on an XBn structure made from III-V materials normally operates under background limited conditions (i.e. photo-current >>dark current) at around 150 K, so its dark current at 77 K will be completely negligible. This is generally true, even if its cut-off wavelength is extended to 5.9 µm which is beyond the 5 µm boundary of the MWIR atmospheric window, as in the embodiment depicted in FIG. 6.

The diagram in FIG. 6 also depicts a buffer layer BF which can be designed with a valence band that is deeper than the valence band of the first photon absorbing layer PAL1 if the first photon absorbing layer is n-type or with a conduction band that is higher than the conduction band of the first photon absorbing layer PAL1 if the first photon absorbing layer is p-type, so that minority carriers created by the absorption of light in the first UPM UPM1 do not escape without being collected by depletion layer in the first diode junction DJ1. For example, in the first case a type II superlattice can be grown which is similar to that used for the first photon absorbing layer PAL1 except that the InAs layers should be highly doped (e.g. $10^{18}$ donors/cm$^3$). Beneath the buffer layer BF the remains of the substrate SBS are shown. The detector structure 100 is usually bonded to a read out circuit ROC and the space between detector structure 100 and read out circuit ROC is filled with a glue under-fill UF as depicted in FIG. 5H. The substrate SBS (not shown in FIG. 5H) can then be polished to a thickness of a few microns or removed altogether. An antireflection coating AR, usually made from a dielectric structure with one or more layers (e.g. a multilayer structure based on dielectric layers of PbTe and $Y_2O_3$ as in Ref. [9]) is often applied to the back of the detector as also depicted in FIG. 6.

Another embodiment of the photodetector 100 of FIG. 6 sensitive to wavelength bands λ1 and λ2 in the MWIR and LWIR can be made using gallium free superlattices where one or both of the photon absorbing layers PAL1 and PAL2 is replaced by a type II InAs/InAsSb superlattice. In Israeli patent application No. 238,368 which is assigned to the assignee of the present invention an example is given of a structure with in-situ passivation that is designed to sense LWIR photons and which could be used for the second UPM UPM2 in FIG. 6. In this structure the photon absorbing layer is a p-type InAs/InAsSb type II superlattice, the barrier layer is a p-type InAs layer or an alloy made from InAsGaAlSb, the passivation layer PL of the in-situ passivation structure ISPS is made from a lattice matched layer of p-type AlSbAs and the cap layer CAPL is made from p-type GaSbAs. The first UPM UPM1 in FIG. 6 can be implemented with a photon absorbing layer PAL1 made from an n-type InAs/InAsSb type II superlattice and the barrier layer BL1 from a AlGaSbAs bulk or digital alloy. The use of gallium free type II superlattice photon absorbing layers may increase the lifetime of the minority carriers and reduce the dark current [4].

It should be noted that in another embodiment the photodetector 100 of FIG. 6 may be configured and operable for detection of two wavelength ranges λ1 and λ2 within the MWIR. For instance λ1 may be the wavelength range 3 µm<λ1<4 µm and λ2 may be for example the wavelength range 4.3 µm<λ2<5 µm. In this embodiment the first photon absorbing layer PAL1 absorbing wavelengths λ1 may be configured as a type II, InAs/GaSb, n-type superlattice with a period of 5 monolayers of InAs and 5 monolayers of GaSb for absorbing photons in the MWIR with a cut-off wavelength of about 4.3 microns. This configuration of the n-type first photon absorbing layer PAL1 has sufficient mobility for its minority charge carriers (holes). The second photon absorbing layer PAL2 absorbing λ2 may be configured as a type II InAs/GaSb, p-type superlattice with a period of 8.8 monolayers of InAs and 10 monolayers of GaSb for absorbing photons in the MWIR with a cut-off wavelength of about 5.0 microns. This second photon absorbing layer PAL2 which is a p-type superlattice is adapted for absorbing wavelength λ2 and also has sufficient mobility of its minority charge carriers (electrons). The barrier layer BL2 may be configured as a p-type type II InAs/AlSb, superlattice with a period of about 10.3 mono-layers of InAs and 4.1 mono-layers of AlSb. The barrier layer BL1 may be a III-V alloy of AlGaSbAs (e.g. $Al_{0.17}Ga_{0.83}Sb_{0.985}As_{0.015}$ for reasonable lattice matching) and may be configured as described above with reference to FIG. 3B (with one part thereof being doped n-type and the other part p-type), or it may be configured as described above with reference to FIG. 3A and doped entirely n-type. The in-situ passivation structure ISPS and the contact layer CL may be configured as described above for the embodiment depicted in FIG. 6 based on an InAs/GaSb type II superlattice. Also here an optical filter FT should be associated/integrated with the photodetector 100, to filter out wavelengths outside the wavelength ranges λ1 and λ2, namely 4-4.3 μm, so that photons coming from the atmosphere, particularly from atmospheric carbon dioxide which emits photons with wavelengths at around 4.2 μm, can be blocked. The detector will usually be fabricated into an array and hybridized to a read out circuit ROC, injected with a glue under-fill UF and polished so that most or all of the substrate SBS and even part of the buffer layer BF is removed, before applying an antireflection coating AR. It will be appreciated by those versed in the art that although superlattices with InAs/GaSb periods of 5/5 and 8.8/10 monolayers have been proposed, these thicknesses are not unique and the same band gaps can be achieved with other combinations which may vary by a few monolayers in one or more of the layer thicknesses (the same is true for the thicknesses of the layers of the InAs/AlSb superlattice used in the second barrier layer BL2). The essential principle however of maintaining a low effective mass for both the electrons in the p-type UPM UPM2 and the holes in the n-type UPM UPM1 must be followed to that the diffusions lengths of the minority carriers in UPM1 and UPM2 are comparable or larger than the thicknesses of their respective photon absorbing layers, PAL1 and PAL2.

It should be noted that the manufacture of a MW/MW detector according to the present invention (based on two UPMs with opposite doping polarities) has an advantage over the previous configuration shown in FIG. 1C (i.e. one that is based on two type II superlattice photon absorbing layers with the same doping polarity and an n-type barrier layer for which a suitable ex-situ passivation treatment exists), in terms of the number of shutter operations required in the growth chamber (e.g. of a molecular beam epitaxy machine). For example, in order to fabricate a device with two type II superlattice photon absorbing layers both doped n-type, the thicknesses of the InAs and GaSb layers in both photon absorbing layers must be made quite thin in order to maintain a sufficiently high minority carrier (i.e. hole) diffusion length. In contrast, the InAs and GaSb layers can be made thicker in the p-type photon absorbing layer of the second UPM UPM2 configured as shown in FIG. 3A or 3B, and still maintain a high minority carrier (i.e. electron) diffusion length. If both photon absorbing layers have a thickness of 4 μm (i.e. 21 and 23 in the conventional nBn device of FIG. 1C, and PAL1 and PAL2 in the present invention of FIG. 3A or 3B), then the present invention requires almost 1500 fewer shutter operations. This corresponds to a 20-30% reduction in the number of shutter operations when a complete device structure is grown, and hence provides a more reliable and less costly growth fabrication process (i.e. more devices can be grown before the reactor must be opened in order to replace the shutters).

The invention claimed is:

1. A photodetector for dual band photo detection, the photo detector comprising:
    a stack of semiconductor layers defining a first unipolar photosensitive module (UPM) and a second UPM of respectively opposite doping polarities; and
    a contact layer comprising at least one of a metal material or a semiconductor material having doping polarity opposite to that of the second UPM;
    wherein the first and second UPMs are respectively adapted for sensing radiation of different respective first and second wavelengths ranges;
    wherein said second UPM is located upon said first UPM along a certain direction, thereby forming a first diode junction between the first and second UPMs;
    wherein said contact layer is located on said second UPM, thereby forming a second diode junction between the second UPM and the contact layer; and
    wherein said first and second diode junctions have respectively opposite conduction directions, thereby enabling to selectively sense electrical signals associated with said first and second wavelengths ranges.

2. The photodetector of claim 1 wherein:
    application of reverse bias voltage to said first diode junction provides removal of excess minority carriers of a first charge polarity, which are created in response to absorption of radiation of the first wavelength range by said first UPM, from said first UPM to said first diode junction thereby enabling said first diode junction to operate in the reverse bias applied thereto for passing photocurrent associated with the absorption of said radiation of the first wavelength range thereby generating a first electrical signal indicative of said radiation of the first wavelength range; and
    application of reverse bias voltage to said second diode junction provides for removal of excess minority carriers of a second charge polarity opposite to said first charge polarity, which are created in response to absorption of radiation of the second wavelength range by said second UPM, from said second UPM to said second diode junction, thereby enabling said second diode junction to operate in the reverse bias applied thereto for passing photocurrent associated with the absorption of said radiation of the second wavelength range thereby generating a second electrical signal indicative of said radiation of the second wavelength range.

3. The photo detector of claim 1 wherein:
    said first UPM comprises a first photon absorbing layer defining a first energy band gap adapted for absorbing photons with energy of said first wavelength range; and a first barrier layer configured with an energy band gap higher than said first energy band gap; and wherein said first photon absorbing layer and at least a region of the first barrier layer which interfaces the first photon absorbing layer have a certain similar first doping polarity, such that said first photon absorbing layer and said region of the first barrier layer form said first unipolar module with no depletion region formed in the first photon absorbing layer, thereby resulting in diffusion limited dark current from said first photon absorbing layer; and said first barrier layer has an energy band structure configured such that the first barrier layer defines an energy band barrier for majority carriers associated with said first doping polarity and such that minority carriers of said first photon absorbing layer with said first doping polarity can flow across said first barrier layer.

4. The photo detector of claim 1 wherein:

said second UPM comprises a second photon absorbing layer defining a second energy band gap adapted for absorbing photons with energy of said second wavelength range; and a second barrier layer configured with an energy band gap higher than said second energy band gap; and wherein said second photon absorbing layer and at least a region of the second barrier layer which interfaces the second photon absorbing layer have a certain similar second doping polarity opposite to said first doping polarity, such that said second photon absorbing layer and said region of the second barrier layer form said second unipolar module with no depletion region formed in the second photon absorbing layer, thereby resulting in diffusion limited dark current from said second photon absorbing layer; and said second barrier layer has an energy band structure configured such that the second barrier layer defines an energy band barrier for majority carriers associated with said second doping polarity and such that minority carriers of said second photon absorbing layer with said second doping polarity can flow across said second barrier layer.

5. The photo detector of claim 1, further comprising:

a plurality of pixels; and wherein said contact layer comprises a respective plurality of spaced apart electric contact regions laterally arranged to define said plurality of pixels.

6. The photo detector of claim 5 wherein at least one of the following:

trenches are vertically etched down to at least a barrier layer of said first UPM between said spaced apart electric contact regions defining said plurality of pixels to thereby suppress cross conduction of electrical signals between said pixels; or said second UPM is configured such that a level of disorder in the periodicity of the photon absorbing layer thereof is sufficiently high such that an energy band of the majority carriers in said photon absorbing layer is below a minimum metallic conductivity to thereby suppress cross conduction of electrical signals between said pixels originating due to absorption of light in said first UPM.

7. The photo detector of claim 5, further comprising an in situ passivation structure in regions between said plurality of spaced apart electric contact regions comprising at least one layer located on the second barrier layer and having a large energy band gap and including a material having a high density of surface states for forcing pinning of an equilibrium Fermi level of the passivation structure to be within its large energy band gap, away from the conduction and valence bands of the second barrier layer, thereby reducing surface leakage and suppressing cross conductivity between the pixels.

8. The photo detector of claim 1 wherein the photons of said second wavelength range have energy lower than photons of said first wavelength range; said photo detector is configured such that photons to be detected propagate in a general direction from said first UPM having a first photon absorbing layer of a first energy band gap to the second UPM having a second photon absorbing layer of a second energy band gap lower than said first energy band gap.

9. The photo detector of claim 8 wherein said second UPM has a doping polarity that is p-type doping polarity.

10. The photo detector of claim 9 wherein said second wavelength range is in the long wave infra-red regime (LWIR), and wherein a photon absorbing layer of the second UPM is configured with an energy band gap adapted for absorption of photons in the LWIR, and wherein said p-type doping polarity provides for improved mobility of minority charge carriers generated in said photon absorbing layer of the second UPM in response to absorption of the LWIR photons, to enable said minority carriers to generate an electrical signal in said contact layer.

11. The photo detector of claim 9 wherein said contact layer is a metal material coupled to said second UPM of the p-type doping polarity, thereby forming said second diode junction as a Schottky diode.

12. The photo detector of claim 9 wherein said contact layer comprises a semiconductor material having n-type doping polarity coupled to said second UPM of the p-type doping polarity, thereby forming said second diode junction as an n-p diode.

13. The photo detector of claim 9 wherein a doping polarity of said first UPM is n-type thereby providing said first diode junction between said first and second UPMs in the form of an n-p diode.

14. The photo detector of claim 8 wherein a doping polarity of said first UPM is p-type and an opposite doping polarity of said second UPM is n-type, thereby forming said first diode junction as an n-p diode.

15. The photo detector of claim 5, further comprising an ex-situ passivation applied to a barrier layer of said second UPM.

16. The photo detector of claim 1 wherein at least one of the following:

said first wavelength range is within the mid-wave infra-red (MWIR) and said second wavelength range is within the long wave infra-red regime (LWIR); or said first wavelength range is a first band of the MWIR and said second wavelength range is a second band within the MWIR with wavelengths longer than said first band.

17. The photo detector of claim 1 wherein one or more spaced apart regions of said contact layer serving as pixel electric contacts associated with one or more respective pixels of the photodetector; said photo detector comprises at least one common contact electrically coupled to at least one of: said first photon absorbing layer of said first UPM, a conducting buffer layer, and a substrate layer on which said first photon absorbing layer is grown; and wherein the photo detector is associated with a voltage source connectable in between at least one pixel contact and said common contact and selectively operable for applying positive and negative voltages in between said pixel and common contacts to selectively obtain an electrical signal indicative of detection of radiation in said second and first wavelength ranges respectively.

18. The photo detector of claim 1, further comprising at least one layer located above said second UPM and having reflective properties with respect to said second wavelength band such that radiation in said second wavelength range is reflected from said layer back for a second pass through the second UPM.

19. A method for fabrication of a photodetector for dual band photo detection, the method comprising:
   (a) fabricating a first unipolar photosensitive module (UPM) of a first doping polarity, said fabrication of the first UPM comprising:
      growing a buffer layer on a substrate;
      growing a first photon absorbing layer on said buffer layer doped with a certain first doping polarity; and
      growing a first barrier layer doped in at least a first region thereof, which interfaces with the first photon absorbing layer, with the same first doping polarity;
   (b) fabricating a second UPM of a second doping polarity opposite to said first doping polarity on top of said first UPM thereby forming a first diode junction between the first and second UPMs; said fabrication of the second UPM comprising:
      growing a second photon absorbing layer doped with the second doping polarity above said first barrier layer; and
      growing a second barrier layer with at least a region thereof interfacing the second photon absorbing layer, doped with the second doping polarity; and
   (c) fabricating a contact layer above said second barrier layer thereby forming a second diode junction between the second UPM and the contact layer.

20. The method according to claim 19, further comprising: (d) passivating the photodetector, and wherein said passivating comprises at least one of the following:
   growing an in-situ passivation structure on top of the second barrier layer; and said fabricating of the contact layer comprises etching vias through the in-situ passivation structure to expose spaced apart regions of the second barrier layer and depositing spaced apart metallic contacts on the exposed regions of the second barrier layer; or
   said fabricating of the contact layer comprises growing, in-situ on the barrier layer, a semiconductor contact layer doped with the first doping polarity being opposite to the second doping polarity of the second barrier layer, and etching the contact layer to define one or more spaced apart contact regions surrounded by exposed regions of the second barrier layer; and wherein said passivating comprises applying ex-situ passivation to the exposed regions of the second barrier layer.

21. The method according to claim 19, further comprising at least one of the following:
   etching trenches down to the first barrier layer and depositing ex-situ passivation on exposed surfaces of said trenches; or
   said growing of the second photon absorbing layer comprises introduction of a disordered distribution of ionized dopants to thereby localize majority carriers of the second photon absorbing layer.

22. A method for dual band photo detection, the method comprising:
   providing a photodetector comprising first and second unipolar photosensitive modules (UPMs) that are adapted for sensing radiation of different respective first and second wavelength ranges and a contact layer, coupled together along a general direction of radiation propagation through the photodetector, whereby the first and second UPMs have respectively opposite doping polarities such that a first diode junction of a first conduction direction is formed between the first and second UPM, and said contact layer is located on said second UPM to form a second diode junction of a second conduction direction, being opposite to said first conduction direction; and
   operating said photodetector for selectively sensing one of said first and second wavelength ranges by applying reverse bias voltage to a respective one of said first and second diode junctions to thereby enable selective collection of photocurrent generated by a respective one of said first and second UPMs and associated with a respective one of said first and second wavelength ranges.

* * * * *